(12) United States Patent
Koshimizu

(10) Patent No.: US 12,362,144 B2
(45) Date of Patent: Jul. 15, 2025

(54) PLASMA PROCESSING APPARATUS AND METHOD FOR CONTROLLING SOURCE FREQUENCY OF SOURCE RADIO-FREQUENCY POWER

(71) Applicant: Tokyo Electron Limited, Tokyo (JP)

(72) Inventor: Chishio Koshimizu, Miyagi (JP)

(73) Assignee: TOKYO ELECTRON LIMITED, Tokyo (JP)

(\*) Notice: Subject to any disclaimer, the term of this patent is extended or adjusted under 35 U.S.C. 154(b) by 178 days.

(21) Appl. No.: 18/227,320

(22) Filed: Jul. 28, 2023

(65) Prior Publication Data

US 2023/0369020 A1 Nov. 16, 2023

Related U.S. Application Data

(63) Continuation of application No. PCT/JP2022/002200, filed on Jan. 21, 2022.

(30) Foreign Application Priority Data

Jan. 29, 2021 (JP) ................. 2021-012985

(51) Int. Cl.
*H01J 37/32* (2006.01)

(52) U.S. Cl.
CPC .. *H01J 37/32174* (2013.01); *H01J 37/32568* (2013.01); *H01J 37/32091* (2013.01); *H01J 2237/327* (2013.01)

(58) Field of Classification Search
CPC .......... H01J 37/32174; H01J 37/32568; H01J 37/32091; H01J 2237/327
See application file for complete search history.

(56) References Cited

U.S. PATENT DOCUMENTS 11,670,488 B2\* 6/2023 Savas ............... H01J 37/32183
　　　　　　　　　　　　　　　　　　　　315/111.21
11,749,503 B2\* 9/2023 Yoshimura ........ H01J 37/32165
　　　　　　　　　　　　　　　　　　　　156/345.35
(Continued)

FOREIGN PATENT DOCUMENTS

CN　　115863129 A　\*　3/2023　........ H01J 37/32165
CN　　116724669 A　\*　9/2023　........ H01J 37/32091
(Continued)

OTHER PUBLICATIONS

International Search Report and Written Opinion mailed on Mar. 22, 2022, received for PCT Application PCT/JP2022/002200, filed on Jan. 21, 2022, 9 pages including English Translation.

*Primary Examiner* — Adam D Houston
(74) *Attorney, Agent, or Firm* — XSENSUS LLP

(57) ABSTRACT

A plasma processing apparatus includes a chamber, a substrate support, a radio-frequency power supply, and a bias power supply. The radio-frequency power supply generates source radio-frequency power to generate plasma in the chamber. The bias power supply provides a pulse of bias energy to a bias electrode in each of a plurality of pulse periods. The radio-frequency power supply sets, based on a change in a degree of reflection of the source radio-frequency power, a source frequency of the source radio-frequency power in each of a plurality of phase periods in each of a plurality of overlap periods. Each of the plurality of overlap periods overlaps a corresponding pulse period of the plurality of pulse periods. The degree of reflection is identified with the source frequency being set differently in identical phase periods in two or more preceding overlap periods.

20 Claims, 10 Drawing Sheets

(56) References Cited

U.S. PATENT DOCUMENTS

| | | | |
|---|---|---|---|
| 11,935,729 B2* | 3/2024 | Tamura | H01L 21/67109 |
| 12,068,132 B2* | 8/2024 | Hasegawa | H01J 37/32165 |
| 12,249,486 B2* | 3/2025 | Koshimizu | H01J 37/32155 |
| 12,249,487 B2* | 3/2025 | Koshimizu | H01J 37/32183 |
| 2005/0106873 A1* | 5/2005 | Hoffman | H01J 37/32091 |
| | | | 438/689 |
| 2009/0284156 A1* | 11/2009 | Banna | H01J 37/32155 |
| | | | 315/111.21 |
| 2010/0276391 A1* | 11/2010 | Grimbergen | H01J 37/32174 |
| | | | 216/41 |
| 2012/0217221 A1* | 8/2012 | Hoffman | C23C 16/50 |
| | | | 216/61 |
| 2017/0062187 A1* | 3/2017 | Radomski | H01J 37/32155 |
| 2017/0103873 A1* | 4/2017 | Kawasaki | H01J 37/32183 |
| 2022/0364230 A1* | 11/2022 | Li | C23C 16/4554 |
| 2022/0384150 A1* | 12/2022 | Koshimizu | H01J 37/32183 |
| 2022/0406566 A1* | 12/2022 | Koshimizu | H01J 37/32091 |
| 2023/0223235 A1* | 7/2023 | Oldziej | H01J 37/32183 |
| | | | 327/291 |
| 2023/0369019 A1* | 11/2023 | Tamamushi | H01J 37/32183 |
| 2023/0369020 A1* | 11/2023 | Koshimizu | H01J 37/32146 |
| 2023/0395360 A1* | 12/2023 | Shihommatsu | H01J 37/32816 |
| 2024/0071723 A1* | 2/2024 | Suda | H01J 37/32165 |
| 2024/0222080 A1* | 7/2024 | Kosaka | H01J 37/32082 |
| 2024/0347320 A1* | 10/2024 | Koshimizu | H05H 1/46 |
| 2025/0014872 A1* | 1/2025 | Koshimizu | H01L 21/2015 |
| 2025/0087454 A1* | 3/2025 | Kumakura | H01L 21/02274 |
| 2025/0087455 A1* | 3/2025 | Kumakura | H01J 37/3056 |

FOREIGN PATENT DOCUMENTS

| | | | | |
|---|---|---|---|---|
| JP | 2013-033860 A | | 2/2013 | |
| JP | 2017-174537 A | | 9/2017 | |
| JP | 2020-526007 A | | 8/2020 | |
| JP | 2022075506 A | * | 5/2022 | H01J 37/32146 |
| JP | 2022184788 A | * | 12/2022 | H01J 37/32183 |
| JP | 2023129234 A | * | 9/2023 | |
| WO | 2005/057993 A1 | | 6/2005 | |
| WO | WO-2022163535 A1 | * | 8/2022 | H01J 37/32091 |
| WO | WO-2023090252 A1 | * | 5/2023 | H01J 37/32091 |
| WO | WO-2023090256 A1 | * | 5/2023 | H01J 37/32091 |
| WO | WO-2023127655 A1 | * | 7/2023 | H01J 37/32146 |
| WO | WO-2023176555 A1 | * | 9/2023 | H01J 37/32128 |

* cited by examiner

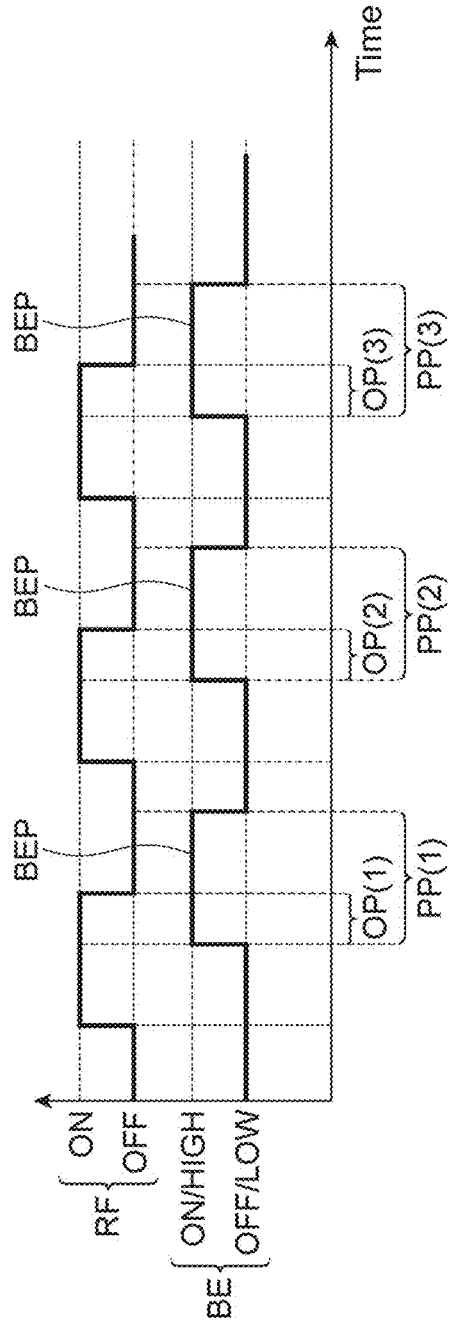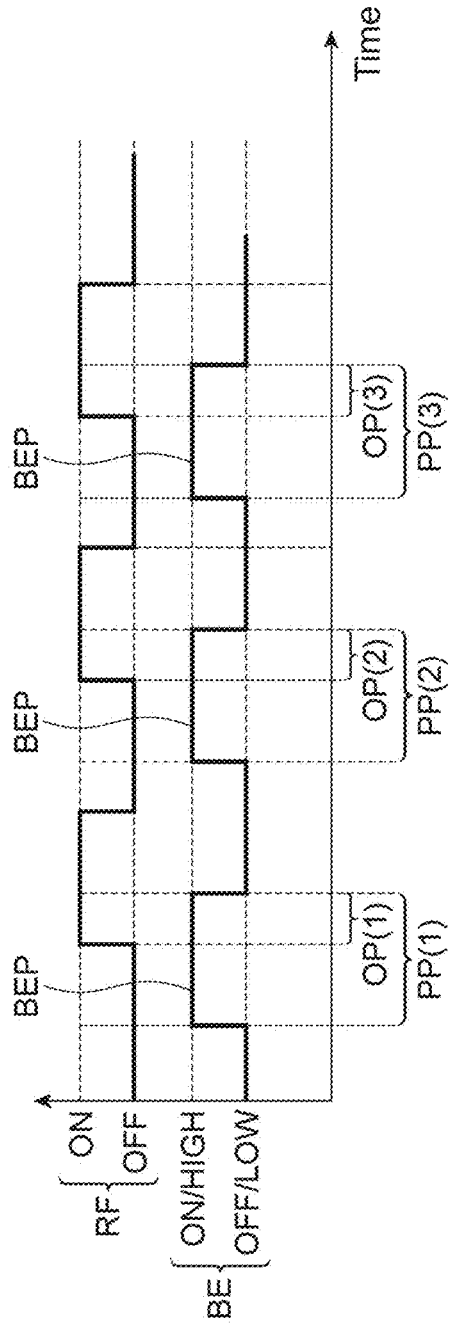

PLASMA PROCESSING APPARATUS AND METHOD FOR CONTROLLING SOURCE FREQUENCY OF SOURCE RADIO-FREQUENCY POWER

CROSS-REFERENCE TO RELATED APPLICATIONS

The present application is a bypass continuation application of International Application No. PCT/JP2022/002200, filed Jan. 21, 2022, which claims priority to Japanese patent application No. 2021-012985, filed Jan. 29, 2021, the entire contents of each of which is incorporated herein by reference.

FIELD

Exemplary embodiments of the present disclosure relate to a plasma processing apparatus and a method for controlling the source frequency of source radio-frequency (RF) power.

BACKGROUND

Plasma processing is performed on substrates using a plasma processing apparatus. The plasma processing apparatus uses bias RF power to draw ions in plasma generated in a chamber toward a substrate. Patent Literature 1 below describes a plasma processing apparatus that modulates the power level and the frequency of bias RF power.

CITATION LIST

Patent Literature

Patent Literature 1: Japanese Unexamined Patent Application Publication No. 2009-246091

BRIEF SUMMARY

Technical Problem

One or more aspects of the present disclosure are directed to a plasma processing apparatus that reduces the degree of reflection of source radio-frequency power.

Solution to Problem

A plasma processing apparatus according to one exemplary embodiment includes a chamber, a substrate support, a radio-frequency power supply, and a bias power supply. The substrate support is located in the chamber and includes a bias electrode. The radio-frequency power supply generates source radio-frequency power to generate plasma in the chamber. The bias power supply provides a pulse of bias energy to the bias electrode in each of a plurality of pulse periods. The bias power supply periodically provides the bias energy having a waveform cycle to the bias electrode in each of the plurality of pulse periods. The radio-frequency power supply sets a source frequency of the source radio-frequency power in each of a plurality of phase periods in each of a plurality of waveform cycles of the bias energy included in each of a plurality of overlap periods. Each of the plurality of overlap periods overlaps a corresponding pulse period of the plurality of pulse periods. The radio-frequency power supply performs interpulse feedback. The interpulse feedback includes adjusting the source frequency $f(k, m, n)$ based on a change in the degree of reflection of the source radio-frequency power. The symbol $f(k, m, n)$ refers to the source frequency in the n-th phase period in the m-th waveform cycle in the k-th overlap period of the plurality of overlap periods. The change in the degree of reflection is identified with the source frequency being set differently in the n-th phase period in the m-th waveform cycle in each of two or more overlap periods preceding the k-th overlap period.

Advantageous Effects

The plasma processing apparatus according to the above exemplary embodiment reduces the degree of reflection of the source radio-frequency power.

BRIEF DESCRIPTION OF DRAWINGS

FIGS. 4A and 4B are each an example timing chart of source RF power and bias energy.

DETAILED DESCRIPTION

Figure 1:
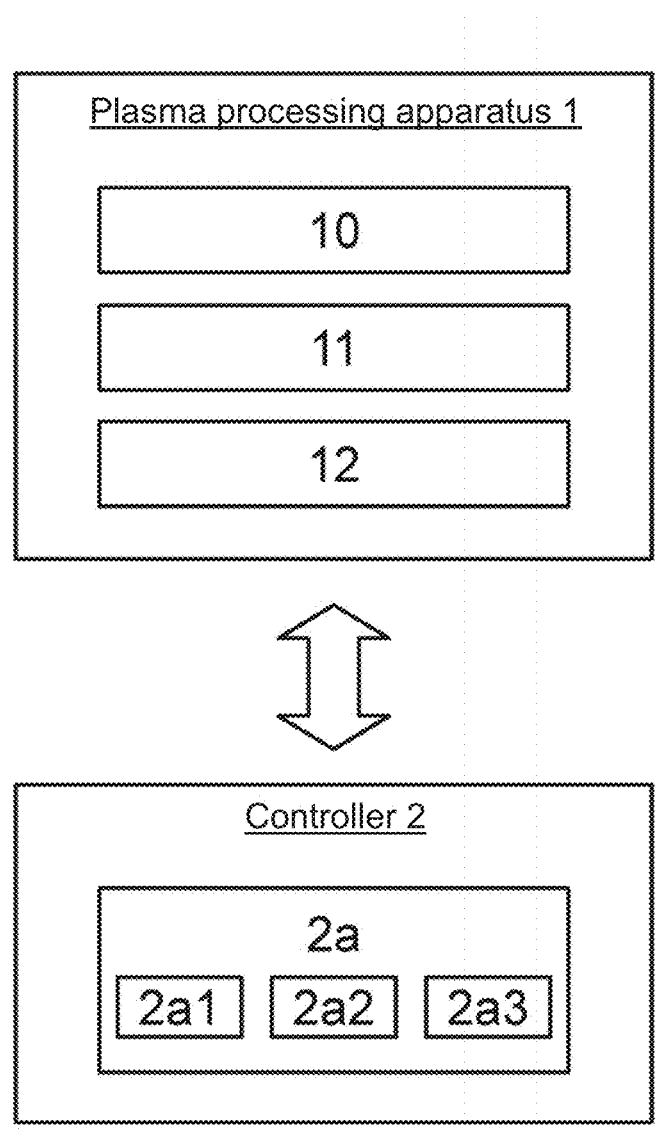
FIG. 1 is a schematic diagram of a plasma processing apparatus according to one exemplary embodiment.

Exemplary embodiments will now be described.

A plasma processing apparatus according to one exemplary embodiment includes a chamber, a substrate support, a radio-frequency power supply, and a bias power supply. The substrate support is located in the chamber and includes a bias electrode. The radio-frequency power supply generates source radio-frequency power to generate plasma in the chamber. The bias power supply provides a pulse of bias energy to the bias electrode in each of a plurality of pulse periods. The bias power supply periodically provides the bias energy having a waveform cycle to the bias electrode in each of the plurality of pulse periods. The radio-frequency power supply sets a source frequency of the source radio-frequency power in each of a plurality of phase periods in each of a plurality of waveform cycles of the bias energy included in each of a plurality of overlap periods. Each of the plurality of overlap periods overlaps a corresponding pulse period of the plurality of pulse periods. The radio-frequency power supply performs interpulse feedback. The interpulse feedback includes adjusting the source frequency $f(k, m, n)$ based on a change in the degree of reflection of the source radio-frequency power. The symbol $f(k, m, n)$ refers to the source frequency in the n-th phase period in the m-th waveform cycle in the k-th overlap period of the plurality of overlap periods. The change in the degree of reflection is identified with the source frequency being set differently in the n-th phase period in the m-th waveform cycle in each of two or more overlap periods preceding the k-th overlap period.

The source frequency is set differently in identical phase periods in identical waveform cycles in two or more overlap periods to identify the relationship between a change in the source frequency (frequency shift) and a change in the degree of reflection of the source radio-frequency power. Thus, the structure according to the above embodiment can adjust the source frequency in the n-th phase period in the m-th waveform cycle in the k-th overlap period to reduce the degree of reflection based on a change in the degree of reflection. The structure according to the above embodiment can also reduce the degree of reflection rapidly in each waveform cycle in each overlap period.

In one exemplary embodiment, two or more overlap periods may include a $(k-K_1)$th overlap period and a $(k-K_2)$th overlap period. $K_1$ and $K_2$ are natural numbers satisfying $K_1 > K_2$.

In one exemplary embodiment, the interpulse feedback may include setting the source frequency $f(k-K_2, m, n)$ to a frequency resulting from the frequency shift in the first direction from the source frequency $f(k-K_1, m, n)$. The frequency shift in the first direction is either a decrease or an increase in frequency. In response to the degree of reflection decreasing with the source frequency $f(k-K_2, m, n)$ resulting from the frequency shift in the first direction, the interpulse feedback may include setting the source frequency $f(k, m, n)$ to a frequency resulting from the frequency shift in the first direction from the source frequency $f(k-K_2, m, n)$. In response to the degree of reflection increasing with the source frequency $f(k, m, n)$ resulting from the frequency shift in the first direction, the interpulse feedback may include setting the source frequency $f(k+K_3, m, n)$ to an intermediate frequency between the source frequencies $f(k-K_2, m, n)$ and $f(k, m, n)$. $K_3$ is a natural number.

In one exemplary embodiment, the degree of reflection can exceed a threshold when the intermediate frequency is set in the n-th phase period in the m-th waveform cycle in the $(k+K_3)$th overlap period. In this case, the interpulse feedback may include setting the source frequency $f(k+K_4, m, n)$ to a frequency resulting from the frequency shift in the second direction from the intermediate frequency. In this case, the amount of the frequency shift in the second direction has a greater absolute value than the amount of the frequency shift in the first direction. $K_4$ is a natural number satisfying $K_4 > K_3$.

In one exemplary embodiment, the amount of the frequency shift in the first direction may have a greater absolute value for setting the source frequency $f(k, m, n)$ than for setting the source frequency $f(k-K_2, m, n)$.

In one exemplary embodiment, the interpulse feedback may include setting the source frequency $f(k-K_2, m, n)$ to a frequency resulting from the frequency shift in the first direction from the source frequency $f(k-K_1, m, n)$. The frequency shift in the first direction is either a decrease or an increase in frequency. In response to the degree of reflection increasing with the source frequency $f(k-K_2, m, n)$ resulting from the frequency shift in the first direction, the interpulse feedback may include setting the source frequency $f(k, m, n)$ to a frequency resulting from the frequency shift in the second direction from the source frequency $f(k-K_2, m, n)$.

In one exemplary embodiment, the bias energy may be bias radio-frequency power having a bias frequency being the inverse of the time length of the waveform cycle. The bias energy may include a pulse of a voltage provided to the bias electrode in each of the plurality of waveform cycles having a time length being the inverse of the bias frequency.

In one exemplary embodiment, the plurality of overlap periods include first to $K_a$-th overlap periods. $K_a$ is a natural number greater than or equal to 2. The radio-frequency power supply may perform, in each of the waveform cycles $CY(1)$ to $CY(M_a)$ included in each of the overlap periods $OP(1)$ to $OP(K_a)$, an initial process to set the source frequencies in the plurality of phase periods to a plurality of frequencies included in a predefined frequency group. An overlap period $OP(k)$ refers to the k-th overlap period of the plurality of overlap periods. A waveform cycle $CY(m)$ refers to the m-th waveform cycle in each overlap period. The radio-frequency power supply may perform intrapulse feedback in a waveform cycle subsequent to the waveform cycle $CY(M_a)$ in each of the overlap periods $OP(1)$ to $OP(K_a)$. The intrapulse feedback includes adjusting the source frequency $f(k, m, n)$ based on a change in the degree of reflection of the source radio-frequency power occurring when the source frequency is set differently in the n-th phase period in each of two or more waveform cycles preceding the waveform cycle $CY(m)$ in each overlap period.

In one exemplary embodiment, the plurality of overlap periods may further include an overlap period $OP(K_a+1)$ to an overlap period $OP(K_b)$. $K_b$ is a natural number greater than or equal to $(K_a+1)$. The radio-frequency power supply may perform the above initial process in each of the waveform cycle $CY(1)$ to the waveform cycle $CY(M_{b1})$ included in each of the overlap period $OP(K_a+1)$ to the overlap period $OP(K_b)$. The radio-frequency power supply may also perform the above interpulse feedback in the waveform cycle $CY(M_{b1}+1)$ to the waveform cycle $CY(M_{b2})$ included in each of the overlap period $OP(K_a+1)$ to the overlap period $OP(K_b)$. The radio-frequency power supply may also perform the above intrapulse feedback after the waveform cycle $CY(M_{b2})$ in each of the overlap period $OP(K_a+1)$ to the overlap period $OP(K_b)$. $M_{b1}$ and $M_a$ may satisfy $M_{b1} < M_a$.

In one exemplary embodiment, the radio-frequency power supply may perform the above interpulse feedback in the waveform cycle $CY(1)$ to the waveform cycle $CY(M_c)$ included in each of the overlap period $OP(K_b+1)$ to the last overlap period. The radio-frequency power supply may also perform the above intrapulse feedback after the waveform cycle $CY(M_c)$ in each of the overlap period $OP(K_b+1)$ to the last overlap period.

In one exemplary embodiment, in at least one overlap period of second to last overlap periods of the plurality of overlap periods, the radio-frequency power supply may set the source frequency in the n-th phase period in an earliest waveform cycle of the plurality of waveform cycles in which the intrapulse feedback is performed to the source frequency in the n-th phase period in a last waveform cycle of the plurality of waveform cycles included in an overlap period immediately preceding the at least one overlap period, or to an average of source frequencies in n-th phase periods in two or more waveform cycles of the plurality of waveform cycles including the last waveform cycle.

In one exemplary embodiment, the radio-frequency power supply may end the initial process when a monitor value reflecting the degree of reflection falls within a specified range during the initial process.

A method according to another exemplary embodiment is a method for controlling a source frequency of source radio-frequency power. The method includes (a) providing a pulse of bias energy to a bias electrode in each of a plurality of pulse periods. The bias electrode is located on a substrate support in a chamber in a plasma processing apparatus. The bias energy has a waveform cycle and is periodically provided to the bias electrode in each of the plurality of pulse periods. The method further includes providing source radio-frequency power from a radio-frequency power supply to generate plasma in the chamber. The method further includes setting a source frequency of the source radio-frequency power in each of a plurality of phase periods in each of a plurality of waveform cycles of the bias energy included in each of a plurality of overlap periods. Each of the plurality of overlap periods overlaps a corresponding pulse period of the plurality of pulse periods. The source frequency f(k, m, n) is adjusted based on a change in the degree of reflection of the source radio-frequency power. The change in the degree of reflection is identified with the source frequency being set differently in the n-th phase period in the m-th waveform cycle in each of two or more overlap periods of the plurality of overlap periods preceding the k-th overlap period.

Exemplary embodiments will now be described in detail with reference to the drawings. In the figures, the same or corresponding components are given the same reference numerals.

Figure 2:
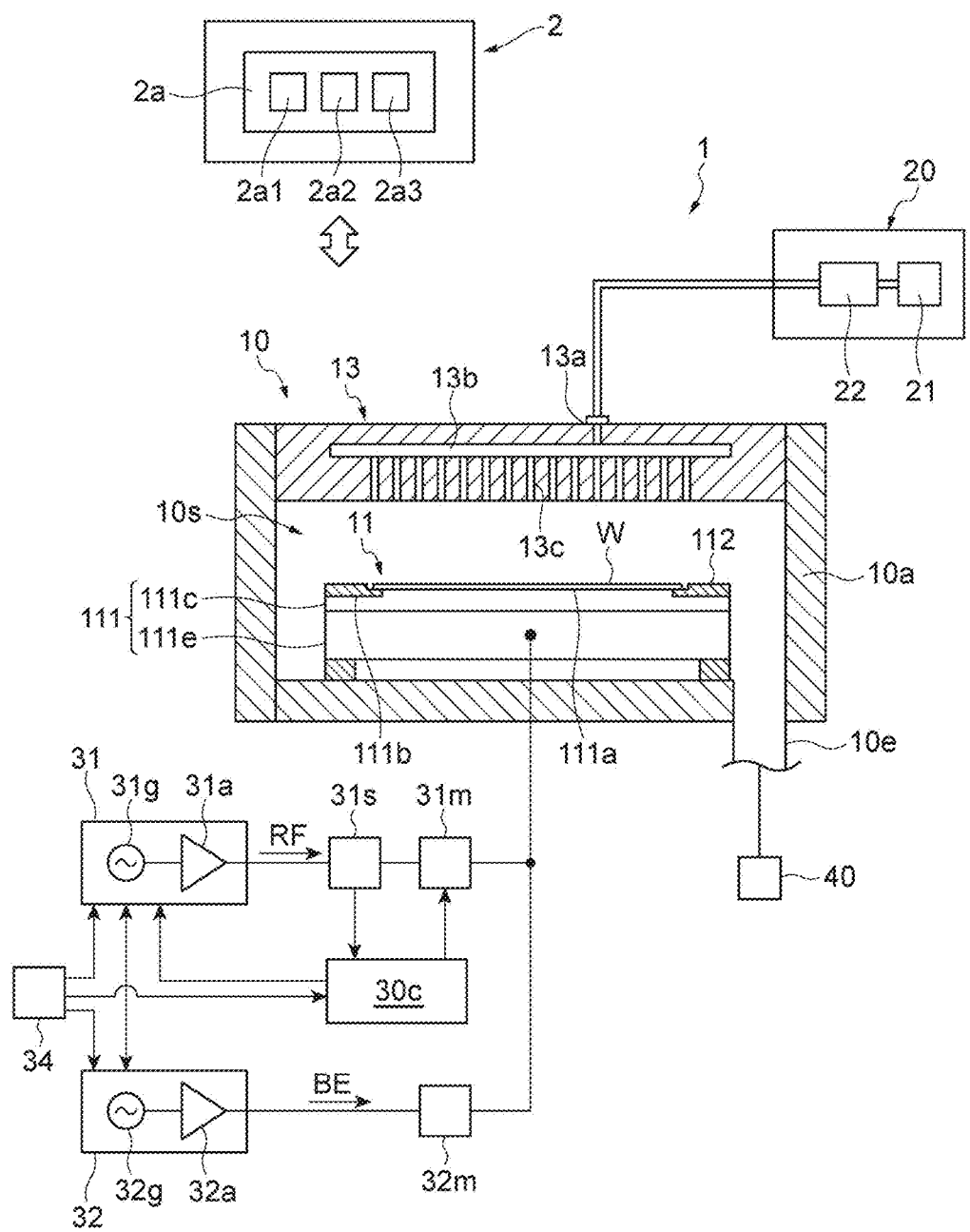
FIG. 2 is a schematic diagram of the plasma processing apparatus according to one exemplary embodiment.

FIGS. 1 and 2 are each a schematic diagram of a plasma processing apparatus according to one exemplary embodiment.

In one embodiment, a plasma processing system includes a plasma processing apparatus 1 and a controller 2. The plasma processing apparatus 1 includes a plasma processing chamber 10, a substrate support 11, and a plasma generator 12. The plasma processing chamber 10 has a plasma processing space. The plasma processing chamber 10 has at least one gas inlet for supplying at least one process gas into the plasma processing space and at least one gas outlet for discharging the gas from the plasma processing space. The gas inlet connects to a gas supply unit 20 (described later). The gas outlet connects to an exhaust system 40 (described later). The substrate support 11 is located in the plasma processing space and has a substrate support surface for supporting a substrate.

The plasma generator 12 generates plasma from at least one process gas supplied into the plasma processing space. The plasma generated in the plasma processing space may be capacitively coupled plasma (CCP), inductively coupled plasma (ICP), electron cyclotron resonance (ECR) plasma, helicon wave plasma (HWP), or surface wave plasma (SWP). Various plasma generators including an alternating current (AC) plasma generator and a direct current (DC) plasma generator may be used.

The controller 2 processes computer-executable instructions that cause the plasma processing apparatus 1 to perform various steps described in one or more embodiments of the present disclosure. The controller 2 may control the components of the plasma processing apparatus 1 to perform various steps described herein. In one embodiment, some or all of the components of the controller 2 may be included in the plasma processing apparatus 1. The controller 2 may include, for example, a computer 2a. The computer 2a may include, for example, a central processing unit (CPU) 2a1, a storage 2a2, and a communication interface 2a3. The CPU 2a1 may perform various control operations based on programs stored in the storage 2a2. The storage 2a2 may include a random-access memory (RAM), a read-only memory (ROM), a hard disk drive (HDD), a solid-state drive (SSD), or a combination of these. The communication interface 2a3 may communicate with the plasma processing apparatus 1 with a communication line such as a local area network (LAN).

An example structure of a capacitively coupled plasma processing apparatus as an example of the plasma processing apparatus 1 will now be described. The capacitively coupled plasma processing apparatus 1 includes a plasma processing chamber 10, a gas supply unit 20, a power supply 30, and an exhaust system 40. The plasma processing apparatus 1 also includes a substrate support 11 and a gas inlet unit. The gas inlet unit allows at least one process gas to be introduced into the plasma processing chamber 10. The gas inlet unit includes a shower head 13. The substrate support 11 is located in the plasma processing chamber 10. The shower head 13 is located above the substrate support 11. In one embodiment, the shower head 13 defines at least a part of the ceiling of the plasma processing chamber 10. The plasma processing chamber 10 has a plasma processing space 10s defined by the shower head 13, a side wall 10a of the plasma processing chamber 10, and the substrate support 11. The side wall 10a is grounded. The shower head 13 and the substrate support 11 are electrically insulated from a housing of the plasma processing chamber 10.

The substrate support 11 includes a body 111 and a ring assembly 112. The body 111 includes a central area (substrate support surface) 111a for supporting a substrate (wafer) W and an annular area (ring support surface) 111b for supporting the ring assembly 112. The annular area 111b of the body 111 surrounds the central area 111a of the body 111 as viewed in plan. The substrate W is located on the central area 111a of the body 111. The ring assembly 112 is located on the annular area 111b of the body 111 to surround the substrate W on the central area 111a of the body 111. In one embodiment, the body 111 includes a base 111e and an electrostatic chuck (ESC) 111c. The base 111e includes a conductive member. The conductive member in the base 111e may serve as a lower electrode. The ESC 111c is located on the base 111e. The upper surface of the ESC 111c includes the substrate support surface 111a. The ring assembly 112 includes one or more annular members. At least one of the annular members is an edge ring. Although not shown in the figures, the substrate support 11 may also include a temperature control module that adjusts at least one of the ESC 111c, the ring assembly 112, or the substrate W to a target temperature. The temperature control module may include a heater, a heat-transfer medium, a channel, or a combination of these. The channel allows a heat-transfer fluid such as brine or gas to flow. The substrate support 11 may include a heat-transfer gas supply unit to supply a heat-transfer gas into a space between the back surface of the substrate W and the substrate support surface 111a.

The shower head 13 introduces at least one process gas from the gas supply unit 20 into the plasma processing space 10s. The shower head 13 has at least one gas inlet 13a, at least one gas-diffusion compartment 13b, and multiple gas inlet ports 13c. The process gas supplied to the gas inlet 13a passes through the gas-diffusion compartment 13b and is introduced into the plasma processing space 10s through the multiple gas inlet ports 13c. The shower head 13 also includes a conductive member. The conductive member in the shower head 13 may serve as an upper electrode. In addition to the shower head 13, the gas inlet unit may include one or more side gas injectors (SGIs) that are installed in one or more openings in the side wall 10a.

The gas supply unit 20 may include at least one gas source 21 and at least one flow controller 22. In one embodiment, the gas supply unit 20 allows supply of at least one process gas from each gas source 21 to the shower head 13 through the corresponding flow controller 22. The flow controller 22 may include, for example, a mass flow controller or a pressure-based flow controller. The gas supply unit 20 may further include one or more flow rate modulators that supply one or more process gases at a modulated flow rate or in a pulsed manner.

The exhaust system 40 may be, for example, connected to a gas outlet 10e in the bottom of the plasma processing chamber 10. The exhaust system 40 may include a pressure control valve and a vacuum pump. The pressure control valve regulates the pressure in the plasma processing space 10s. The vacuum pump may include a turbomolecular pump, a dry pump, or a combination of these.

The plasma processing apparatus 1 further includes a radio-frequency (RF) power supply 31 and a bias power supply 32. The plasma processing apparatus 1 may further include a sensor 31s and a controller 30c.

The RF power supply 31 generates source radio-frequency power RF to generate plasma in the chamber (plasma processing chamber 10). The source radio-frequency power RF has a source frequency of, for example, 13 to 150 MHz inclusive. In one embodiment, the RF power supply 31 may include an RF signal generator 31g and an amplifier 31a. The RF signal generator 31g generates an RF signal. The amplifier 31a amplifies the RF signal input from the RF signal generator 31g to generate the source radio-frequency power RF, and outputs the source radio-frequency power RF. The RF signal generator 31g may include a programmable processor or a programmable logic device such as a field-programmable gate array (FPGA). A digital-to-analog (D/A) converter may be coupled between the RF signal generator 31g and the amplifier 31a.

The RF power supply 31 is coupled to an RF electrode with a matcher 31m in between. In one embodiment, the RF electrode may be included in the base 111e. In another embodiment, the RF electrode may be included in the ESC 111c. The RF electrode may also serve as a bias electrode (described later). In some embodiments, the RF electrode may be the upper electrode. The matcher 31m includes a matching circuit. The matching circuit in the matcher 31m has a variable impedance. The matching circuit in the matcher 31m is controlled by the controller 30c. The impedance of the matching circuit in the matcher 31m is adjusted to match the impedance of a load coupled to the RF power supply 31 with the output impedance of the RF power supply 31.

The sensor 31s outputs, to the controller 30c, a reflected wave of the source radio-frequency power RF returning from the load coupled to the RF power supply 31. The sensor 31s may be coupled between the RF power supply 31 and the matcher 31m. The sensor 31s may be coupled between the matcher 31m and the RF electrode. For example, the sensor 31s may be coupled between the bias electrode and the junction of an electric path extending from the matcher 31m to the bias electrode and an electric path extending from a matcher 32m (described later) to the bias electrode. In some embodiments, the sensor 31s may be coupled between the junction and the matcher 31m. The sensor 31s includes, for example, a directional coupler. The directional coupler outputs the reflected wave returning from the load coupled to the RF power supply 31. The reflected wave output from the directional coupler is converted to a digital signal by analog-to-digital (A/D) conversion. The digital reflected wave is used in the controller 30c. The sensor 31s may be separate from the matcher 31m, or may be a part of the matcher 31m.

The bias power supply 32 is electrically coupled to the bias electrode. In one embodiment, the bias electrode is included in the base 111e. In another embodiment, the bias electrode may be included in the ESC 111c. The bias power supply 32 provides a pulse BEP of bias energy BE to the bias electrode in each of multiple pulse periods PP. The bias power supply 32 may determine the timing of each of the multiple pulse periods PP in response to a signal provided from a pulse controller 34. The controller 2 may serve as the pulse controller 34.

FIGS. 3A, 3B, 4A, and 4B will now be referred to. FIGS. 3A, 3B, 4A, and 4B are each an example timing chart of the source radio-frequency power RF and the bias energy BE. In the figures, the source radio-frequency power RF being ON indicates the source radio-frequency power RF being provided, and the source radio-frequency power RF being OFF indicates the source radio-frequency power RF being stopped. In the figures, the bias energy BE being ON indicates the bias energy BE being provided to the bias electrode, and the bias energy BE being OFF indicates the bias energy BE not being provided to the bias electrode. In the figures, the bias energy BE at HIGH indicates the bias energy BE at a higher level than the bias energy BE at LOW being provided to the bias electrode.

The multiple pulse periods PP occur in time sequence. The multiple pulse periods PP may occur in sequence at a time interval (cycle) being the inverse of the pulse frequency. A pulse period PP(k) herein refers to the k-th pulse period of the multiple pulse periods PP. In other words, a pulse period PP(k) refers to any pulse period of the multiple pulse periods PP. The pulse frequency is lower than the bias frequency (described later), and may be, for example, 1 to 100 kHz inclusive. As described above, the pulse BEP of the bias energy BE is provided to the bias electrode in each of the multiple pulse periods PP. In the periods other than the multiple pulse periods PP, the bias energy BE may not be provided to the bias electrode. In some embodiments, the bias energy BE at a lower level than the bias energy BE in the multiple pulse periods PP may be provided to the bias electrode in the periods other than the multiple pulse periods PP.

Figure 3A:
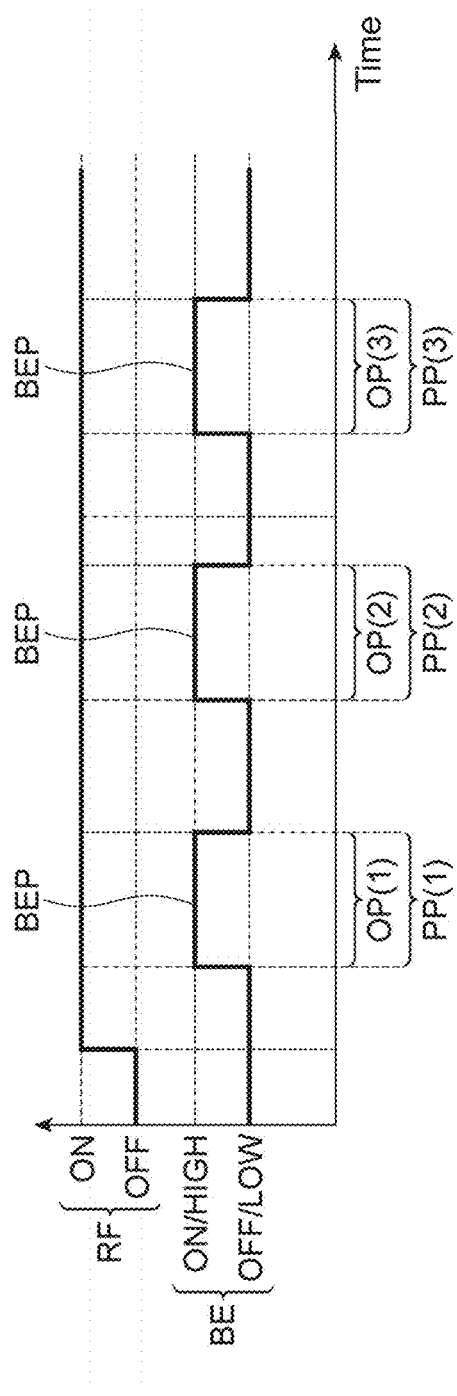
FIGS. 3A and 3B are each an example timing chart of source RF power and bias energy.

As shown in FIG. 3A, the source radio-frequency power RF may be provided as a continuous wave. In the example of FIG. 3A, multiple overlap periods OP in which the source radio-frequency power RF is provided in the multiple pulse periods PP each coincide with the corresponding one of the multiple pulse periods PP.

Figure 3B:
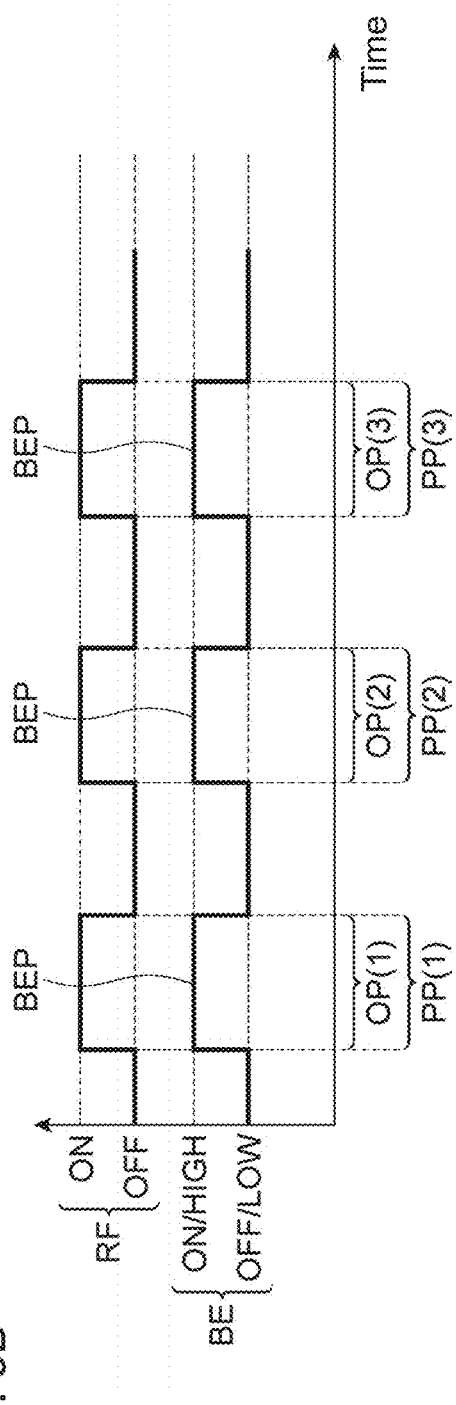

In some embodiments, as shown in FIGS. 3B, 4A, and 4B, the source radio-frequency power RF may be provided in a pulsed manner. The RF power supply 31 may determine the timing at which each pulse of the source radio-frequency power RF is provided in response to a signal provided from the pulse controller 34. As shown in FIG. 3B, the pulses of the source radio-frequency power RF may be provided in the multiple periods that coincide with the respective multiple pulse periods PP. In the example of FIG. 3B, the multiple overlap periods OP in which the source radio-frequency power RF is provided in the multiple pulse periods PP each coincide with the corresponding one of the multiple pulse periods PP. As shown in FIGS. 4A and 4B, the pulses of the source radio-frequency power RF may be provided in multiple periods each partially overlapping the corresponding pulse period PP. In the examples of FIGS. 4A and 4B, each of the multiple overlap periods OP in which the source radio-frequency power RF is provided in the multiple pulse periods PP is a part of the corresponding one of the multiple pulse periods PP. An overlap period OP(k) herein refers to the k-th overlap period of the multiple overlap periods OP. In other words, an overlap period OP(k) refers to any overlap period of the multiple overlap periods OP.

The bias energy BE is provided to the bias electrode in each of the multiple waveform cycles CY in each of the multiple pulse periods PP. In other words, the bias energy BE is periodically provided to the bias electrode in each of the multiple pulse periods PP. Each of the multiple waveform cycles CY is defined by the bias frequency that may be, for example, 50 kHz to 27 MHz inclusive. Each of the multiple waveform cycles CY has a time length being the inverse of the bias frequency. The multiple waveform cycles CY occur in time sequence. A waveform cycle CY(m) herein refers to the m-th waveform cycle of the multiple waveform cycles CY in each of the multiple overlap periods OP A waveform cycle CY(k, m) refers to the m-th waveform cycle in the k-th overlap period. In other words, a waveform cycle CY(m) refers to any waveform cycle of the multiple waveform cycles CY.

Figure 5:
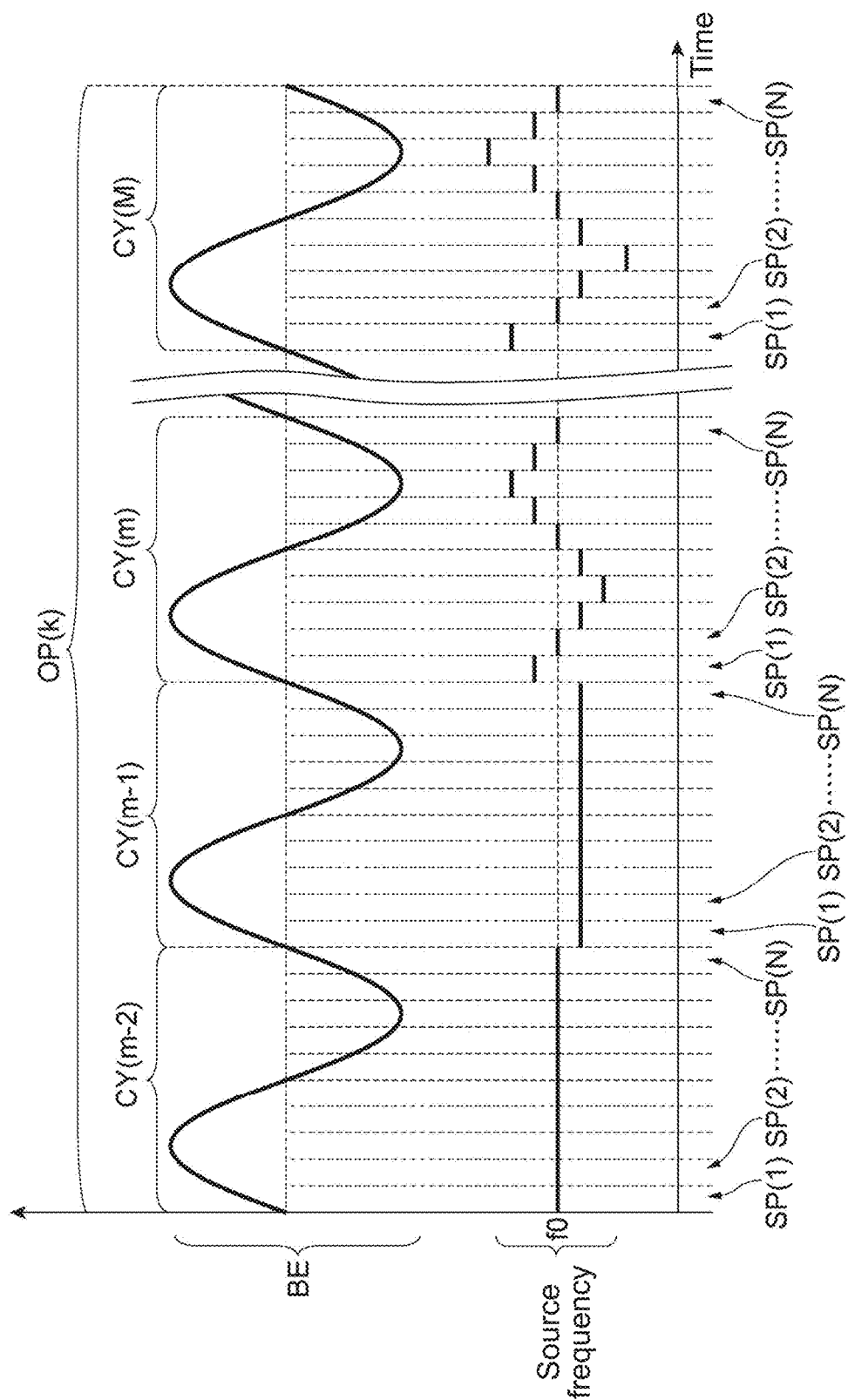
FIG. 5 is an example timing chart of bias energy and the source frequency of source RF power.
Figure 6:
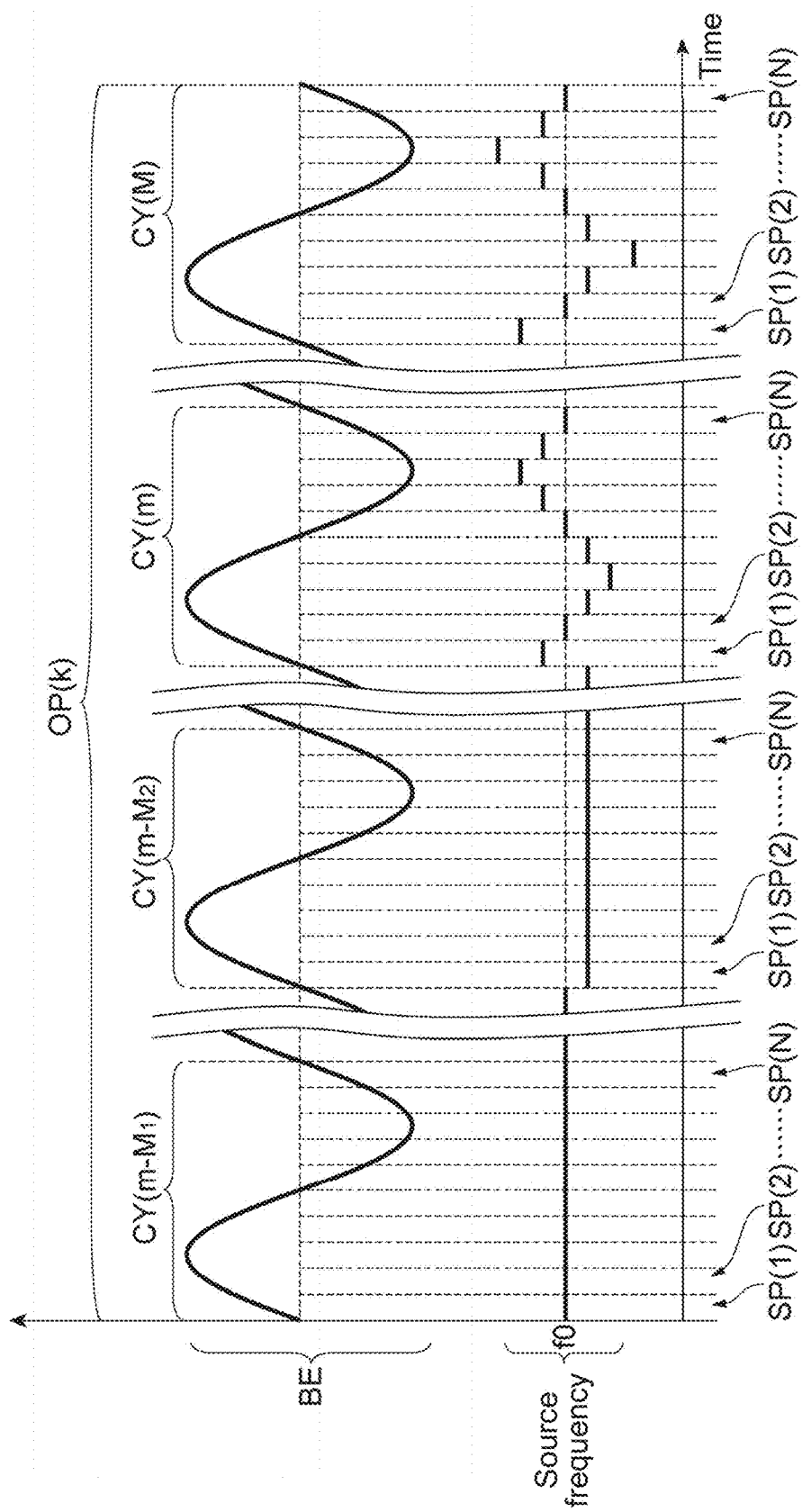
FIG. 6 is another example timing chart of bias energy and the source frequency of source RF power.

FIGS. 5 and 6 will now be referred to. FIG. 5 is an example timing chart of bias energy and the source frequency of source RF power. FIG. 6 is another example timing chart of bias energy and the source frequency of source RF power. In one embodiment, as shown in FIGS. 5 and 6, the bias energy BE may be bias RF power having a bias frequency. The bias RF power has a sinusoidal waveform, with its one cycle being the waveform cycle CY. In this case, as shown in FIG. 2, the bias power supply 32 may include an RF signal generator 32g and an amplifier 32a. The RF signal generator 32g generates an RF signal. The amplifier 32a amplifies the RF signal input from the RF signal generator 32g to generate bias RF power, and provides the generated bias RF power to the bias electrode as the bias energy BE. The RF signal generator 32g may include a programmable processor or a programmable logic device such as an FPGA. A D/A converter may be coupled between the RF signal generator 32g and the amplifier 32a.

For the bias energy BE being bias RF power, the bias power supply 32 is coupled to the bias electrode with the matcher 32m in between. The matcher 32m includes a matching circuit having a variable impedance and controlled by the controller 30c. The impedance of the matching circuit in the matcher 32m is adjusted to match the impedance of a load coupled to the bias power supply 32 with the output impedance of the bias power supply 32.

Figure 7:
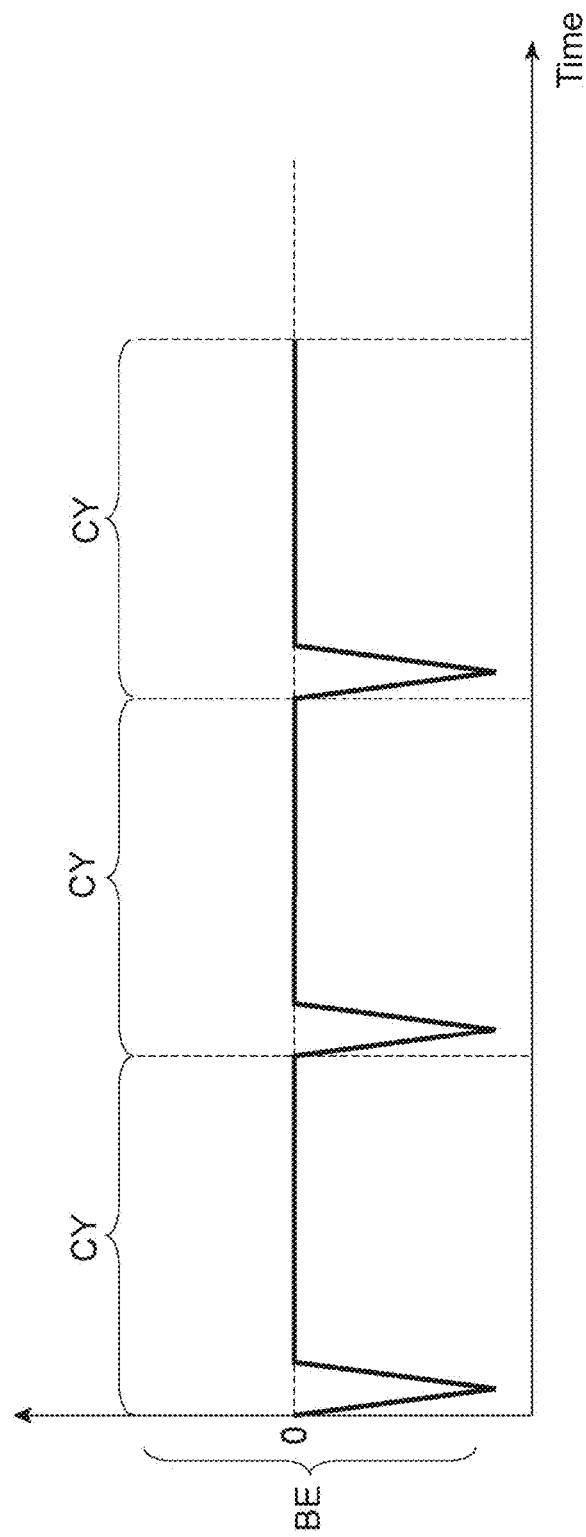
FIG. 7 is another example timing chart of bias energy.

FIG. 7 is another example timing chart of bias energy. In another embodiment, as shown in FIG. 7, the bias energy BE may include a pulse of a voltage provided to the bias electrode in each of the multiple waveform cycles CY. The pulse of the voltage as the bias energy BE may be a pulse of a negative voltage as in the example of FIG. 7, or may be a pulse of any other voltage. The pulse of the voltage as the bias energy BE may have a triangular or square waveform, or any other waveform. For the bias energy BE being the pulse of the voltage, the matcher 32m shown in FIG. 2 may be replaced with a filter coupled between the bias power supply 32 and the bias electrode to block the source radio-frequency power RF.

The bias power supply 32 is synchronized with the RF power supply 31 using a synchronization signal that may be provided from the bias power supply 32 to the RF power supply 31. In some embodiments, the synchronization signal may be provided from the RF power supply 31 to the bias power supply 32. In some embodiments, the synchronization signal may be provided from another device, such as the controller 30c, to the RF power supply 31 and to the bias power supply 32.

The controller 30c controls the RF power supply 31. The controller 30c may include a processor such as a CPU. The controller 30c may be a part of the matcher 31m or a part of the RF power supply 31, or may be separate from the matcher 31m and from the RF power supply 31. In some embodiments, the controller 2 may also serve as the controller 30c.

The controller 30c sets the source frequency of the source radio-frequency power RF in each of the multiple phase periods SP in each of the multiple waveform cycles CY included in each of the multiple overlap periods OP. The source frequency of the source radio-frequency power RF provided in the periods other than the multiple overlap periods OP may be set using the time-series frequencies registered with a predefined table. In the embodiment described below, the source frequency is set by the controller 30c. For the controller 30c being a part of the RF power supply 31, however, the source frequency may be set by the RF power supply 31.

Setting of source frequency of source radio-frequency power RF in overlap periods OP(1) to OP(T−1) (intrapulse feedback)

The setting of the source frequency of the source radio-frequency power RF in the first overlap period OP, or an overlap period OP(1), will be described first. The controller 30c sets the source frequency of the source radio-frequency power RF in each of the multiple phase periods SP in each of the multiple waveform cycles CY in the overlap period OP(1). In the examples of FIGS. 5 and 6, each of the multiple waveform cycles CY in the overlap period OP(1) includes N phase periods SP(1) to SP(N), where N is an integer greater than or equal to 2. The phase periods SP(1) to SP(N) are N phase periods into which each of the multiple waveform cycles CY are divided. The multiple phase periods SP in each of the multiple waveform cycles CY have the time lengths that may be the same as or different from one another. A phase period SP(n) herein refers to the n-th phase period of the phase periods SP(1) to SP(N). In other words, a phase period SP(n) refers to any phase period in each of the multiple waveform cycles CY in each of the multiple overlap periods OP. A phase period SP(m, n) refers to the n-th phase period in the waveform cycle CY(m). A phase period SP(k, m, n) refers to the n-th phase period in the waveform cycle CY(m) in the k-th overlap period OP(k).

In the overlap period OP(1), the controller 30c uses intrapulse feedback to set the source frequency of the source radio-frequency power RF in the phase period SP(m, n). The intrapulse feedback performed in the overlap period OP(k) will now be described in general. For the overlap period OP(1), k is 1 in the intrapulse feedback described below.

In the intrapulse feedback, the controller 30c adjusts the source frequency of the source radio-frequency power RF in the phase period SP(k, m, n) based on a change in the degree of reflection of the source radio-frequency power RF. The degree of reflection of the source radio-frequency power RF is indicated by, for example, a power level Pr of the reflected wave of the source radio-frequency power RF output from the sensor 31s. In the intrapulse feedback, the change in the degree of reflection is identified with the source frequency of the source radio-frequency power RF being set differently in the corresponding phase period SP(n) in each of two or more waveform cycles CY preceding the waveform cycle CY(k, m) in the overlap period OP(k).

In the intrapulse feedback, the source frequency is set differently in the phase periods SP(n) in two or more waveform cycles CY to identify the relationship between a change in the source frequency (frequency shift) and a change in the degree of reflection of the source RF power. Thus, the intrapulse feedback can adjust the source frequency in the phase period SP(k, m, n) to reduce the degree of reflection based on a change in the degree of reflection. The intrapulse feedback can also reduce the degree of reflection rapidly in each of the multiple waveform cycles CY in which the bias energy BE is provided to the bias electrode on the substrate support 11 in the overlap period OP(k).

In one embodiment, the two or more waveform cycles CY preceding the waveform cycle CY(k, m) include a waveform cycle CY(k, m−$M_1$) and a waveform cycle CY(k, m−$M_2$), where $M_1$ and $M_2$ are any natural numbers satisfying $M_1$>$M_2$. In other words, the waveform cycle CY(k, m−$M_2$) is subsequent to the waveform cycle CY(k, m−$M_1$).

In one embodiment, the waveform cycle CY(k, m−$M_1$) may be CY(k, m−2Q), and the waveform cycle CY(k, m−$M_2$) may be CY(k, m−Q), where Q is a natural number. In the example of FIG. 5, Q and $M_2$ are both 1, and 2Q and $M_1$ are both 2. Q may be an integer greater than or equal to 2.

In the intrapulse feedback, the controller 30c sets the source frequency f(k, m−$M_2$, n) to a frequency resulting from the frequency shift in the first direction from the source frequency f(k, m−$M_1$, n). The symbol f(k, m, n) indicates the source frequency of the source radio-frequency power RF in the phase period SP(k, m, n), and is expressed as f(k, m, n)=f(k, m−$M_2$, n)+Δ(k, m, n), where Δ(k, m, n) is a frequency shift amount. The frequency shift in the first direction is either a decrease or an increase in frequency. For the frequency shift in the first direction being a decrease in frequency, Δ(k, m, n) has a negative value. For the frequency shift in the first direction being an increase in frequency, Δ(k, m, n) has a positive value.

In FIGS. 5 and 6, the multiple phase periods SP in the waveform cycle CY(k, m−$M_1$) have the same source frequency, or specifically, f0, but may have different source frequencies. In FIGS. 5 and 6, the multiple phase periods SP in the waveform cycle CY(k, m−$M_2$) have the same source frequency, or specifically, a frequency decreased from f0, but may have a frequency increased from f0.

In the intrapulse feedback, when the degree of reflection decreases with the source frequency f(k, m−$M_2$, n) resulting from the frequency shift in the first direction, the controller 30c sets the source frequency f(k, m, n) to a frequency resulting from the frequency shift in the first direction from the source frequency f(k, m−$M_2$, n). For example, when the power level Pr(k, m−$M_2$, n) decreases from the power level Pr(k, m−$M_1$, n) in response to the frequency shift in the first direction, the controller 30c sets the source frequency f(k, m, n) to a frequency resulting from the frequency shift in the first direction from the source frequency f(k, m−$M_2$, n). The symbol Pr(k, m, n) indicates the power level Pr of the reflected wave of the source radio-frequency power RF in the phase period SP(k, m, n).

In one embodiment, the frequency shift amount Δ(m, n) in the first direction in the phase period SP(k, m, n) may be the same as the frequency shift amount Δ(m−$M_2$, n) in the first direction in the phase period SP(k, m−$M_2$, n). More specifically, the frequency shift amount Δ(k, m, n) may have the same absolute value as the frequency shift amount Δ(k, m−$M_2$, n). In some embodiments, the frequency shift amount Δ(k, m, n) may have a greater absolute value than the frequency shift amount Δ(k, m−$M_2$, n). In some embodiments, the frequency shift amount Δ(k, m, n) may have a greater absolute value for a greater degree of reflection (e.g., for a greater power level Pr(k, m−$M_2$, n) of the reflected wave) in the phase period SP(k, m−$M_2$, n). For example, the frequency shift amount Δ(k, m, n) may have the absolute value determined by a function of the degree of reflection (e.g., the power level Pr(k, m−$M_2$, n) of the reflected wave).

In the intrapulse feedback, the source frequency f(k, m−$M_2$, n) resulting from the frequency shift in the first direction can increase the degree of reflection. For example, the power level Pr(k, m−$M_2$, n) of the reflected wave can increase from the power level Pr(k, m−$M_1$, n) of the reflected wave in response to the frequency shift in the first direction. In this case, the controller 30c may set the source frequency f(k, m, n) to a frequency resulting from the frequency shift in the second direction from the source frequency f(k, m−$M_2$, n). The source frequency in the phase period SP(n) in each of two or more waveform cycles preceding the waveform cycle CY(k, m) may be updated to be a frequency resulting from the frequency shift in the first direction from the source frequency in the phase period SP(n) in its corresponding preceding waveform cycle. In this case, for an upward trend of the degree of reflection (e.g., the power level Pr of the reflected wave) in the phase period SP(n) in each of the two or more waveform cycles, or their average, the source frequency in the phase period SP(n) in the waveform cycle CY(k, m) may be set to a frequency resulting from the frequency shift in the second direction. For example, the source frequency in the phase period SP(n) in the waveform cycle CY(k, m) may be set to a frequency resulting from the frequency shift in the second direction from the source frequency in the earliest of the two or more waveform cycles.

In the intrapulse feedback, the source frequency f(k, m, n) resulting from the frequency shift in the first direction can increase the degree of reflection. For example, the power level Pr(k, m, n) of the reflected wave can increase from the power level Pr(k, m−$M_2$, n) of the reflected wave in response to the frequency shift in the first direction. In this case, the controller 30c may set the source frequency in the phase period SP(n) in the waveform cycle CY(k, m+$M_3$) to an intermediate frequency. The waveform cycle CY(k, m+$M_3$) is subsequent to the waveform cycle CY(k, m), where $M_3$ is a natural number that may satisfy $M_3$=$M_2$. The intermediate frequency that may be set in the phase period SP(k, m+$M_3$, n) is between the source frequencies f(k, m−$M_2$, n) and f(k, m, n), and may be the average of the source frequencies f(k, m−$M_2$, n) and f(k, m, n).

In the intrapulse feedback, the degree of reflection (e.g., the power level Pr) can exceed a predetermined threshold when the intermediate frequency is set in the phase period SP(k, m+$M_3$, n). In this case, the controller 30c may set the source frequency in the phase period SP(n) in the waveform cycle CY(k, m+$M_4$) to a frequency resulting from the frequency shift in the second direction from the intermediate frequency. The waveform cycle CY(k, m+$M_4$) is subsequent to the waveform cycle CY(k, m+$M_3$), where $M_4$ is a natural number that may satisfy $M_4$=$M_1$. The threshold is predetermined. The frequency shift amount Δ(1, m+$M_4$, n) in the second direction has a greater absolute value than the frequency shift amount Δ(1, m, n) in the first direction. This avoids the situation in which the degree of reflection (e.g., the power level Pr of the reflected wave) fails to decrease from a local minimum value. The thresholds for the multiple phase periods SP in each of the multiple waveform cycles CY in the overlap period OP(k) may be the same as or different from one another.

The setting of the source frequency in the overlap period OP(k) (k is 2 to T−1 inclusive, where T is an integer greater than or equal to 3) will now be described. The source frequencies in the multiple phase periods SP in the multiple waveform cycles CY in the overlap period OP(k) may be set by the above intrapulse feedback. In setting the source frequencies in the multiple phase periods SP in the waveform cycle CY(1) in the overlap period OP(k), the waveform cycle CY(M−1) and the waveform cycle CY(M) in the overlap period OP(k−1) may be used as the waveform cycle CY(k, m−$M_1$) and the waveform cycle CY(k, m−$M_2$). The waveform cycle CY(M) is the last waveform cycle in each overlap period. In setting the source frequencies of the source radio-frequency power RF in the multiple phase periods SP in the waveform cycle CY(2) in the overlap period OP(k), the waveform cycle CY(M) in the overlap period OP(k−1) and the waveform cycle CY(1) in the overlap period OP(k) may be used as the waveform cycle CY(k, m−$M_1$) and the waveform cycle CY(k, m−$M_2$).

In another embodiment, the source frequencies in the multiple phase periods SP in the multiple waveform cycles CY in the overlap period OP(k) (k is 1 to T−1 inclusive, where T is an integer greater than or equal to 3) may be set using the corresponding frequencies registered with a predefined table.

Setting of source frequency of source radio-frequency power RF in overlap period OP(T) and subsequent overlap periods (interpulse feedback)

Figure 8:
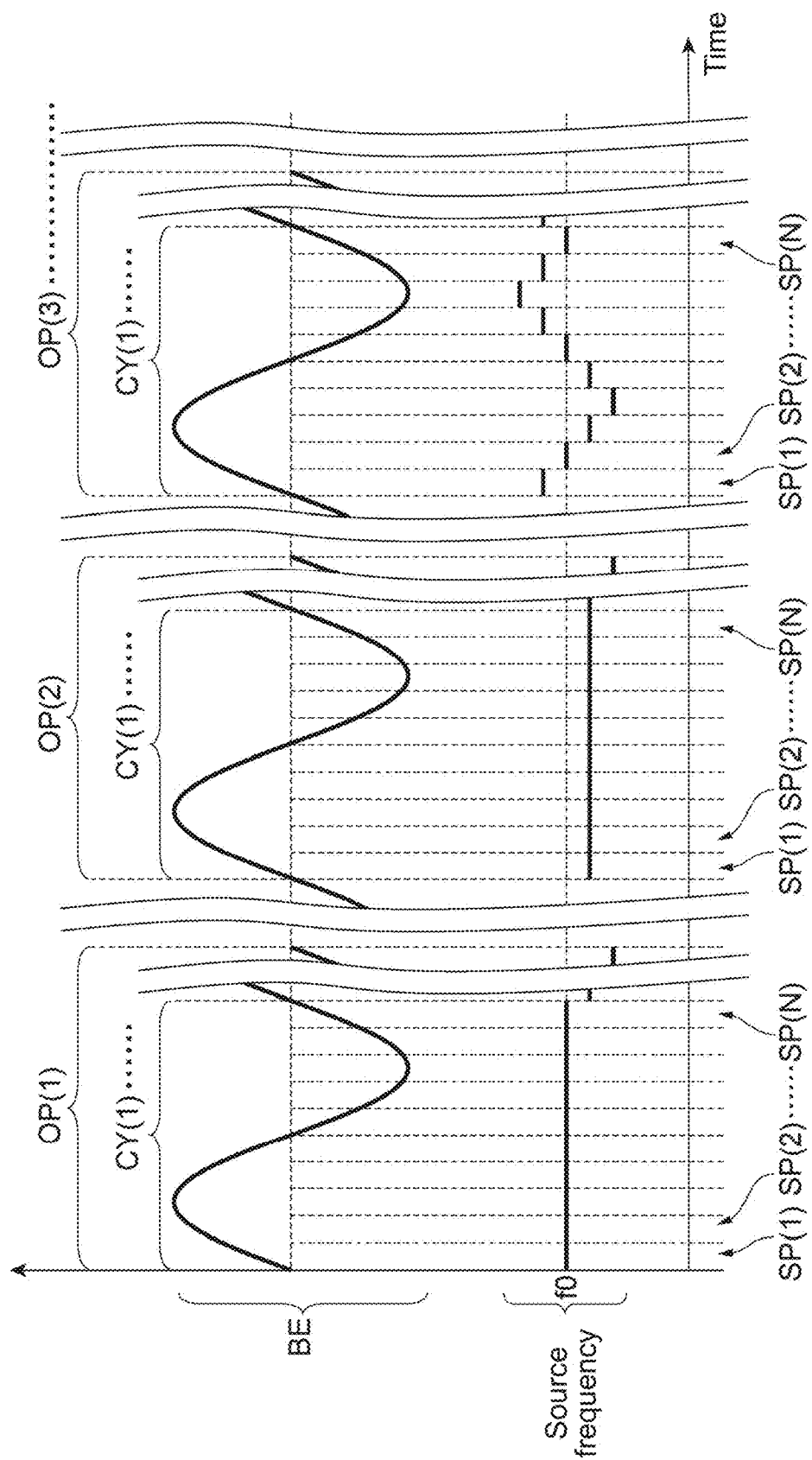
FIG. 8 is an example timing chart of bias energy and the source frequency of source RF power.

The setting of the source frequencies of the source radio-frequency power RF in the k-th (k is an integer greater than or equal to 3) overlap period OP(k) will now be described with reference to FIG. 8. FIG. 8 is an example timing chart of bias energy and the source frequency of source RF power.

The controller 30c uses interpulse feedback to set the source frequency of the source radio-frequency power RF in each of the multiple phase periods SP in each of the multiple waveform cycles CY included in each of the multiple overlap periods OP subsequent to the second overlap period.

In the interpulse feedback, the controller 30c adjusts the source frequency f(k, m, n) based on a change in the degree of reflection of the source radio-frequency power RF. The degree of reflection of the source radio-frequency power RF is indicated by, for example, the power level Pr of the reflected wave of the source radio-frequency power RF output from the sensor 31s. In the interpulse feedback, the change in the degree of reflection is identified with the source frequency of the source radio-frequency power RF being set differently in the corresponding phase period SP(n) in the waveform cycle CY(m) in each of two or more overlap periods OP preceding the overlap period OP(k).

In the interpulse feedback, the source frequency is set differently in identical phase periods in identical waveform cycles in two or more overlap periods OP to identify the relationship between a change in the source frequency (frequency shift) and a change in the degree of reflection of the source RF power. Thus, the interpulse feedback can adjust the source frequency in the phase period SP(k, m, n) to reduce the degree of reflection based on a change in the degree of reflection. The intrapulse feedback can also reduce the degree of reflection rapidly in each of the multiple waveform cycles CY in each of the multiple overlap periods OP.

In one embodiment, the two or more overlap periods OP preceding the overlap period OP(k) include a (k−$K_1$)th overlap period OP(k−$K_1$) and a (k−$K_2$)th overlap period OP(k−$K_2$), where $K_1$ and $K_2$ are natural numbers satisfying $K_1 > K_2$.

In one embodiment, the overlap period OP(k−$K_1$) is the overlap period OP(k−2). The overlap period OP(k−$K_2$) is subsequent to overlap period OP(k−$K_1$), and is the overlap period OP(k−1) in one embodiment.

In other words, $K_2$ is 1, and $K_1$ is 2 in one embodiment.

The controller 30c sets the source frequency f(k−$K_2$, m, n) in the phase period SP(k−$K_2$, m, n) to a frequency resulting from the frequency shift in the first direction from the source frequency in the phase period SP(k−$K_1$, m, n). The symbol f(k, m, n) indicates the source frequency of the source radio-frequency power RF in the phase period SP(k, m, n), and is expressed as f(k, m, n)=f(k−$K_2$, m, n)+Δ(k, m, n), where Δ(k, m, n) is a frequency shift amount. The frequency shift in the first direction is either a decrease or an increase in frequency. For the frequency shift in the first direction being a decrease in frequency, Δ(k, m, n) has a negative value. For the frequency shift in the first direction being an increase in frequency, Δ(k, m, n) has a positive value.

In FIG. 8, the multiple phase periods SP in the waveform cycle CY(2, 1) have the same source frequency, or specifically, a frequency decreased from f0, but may have a frequency increased from f0.

In the interpulse feedback, when the degree of reflection decreases with the source frequency f(k−$K_2$, m, n) resulting from the frequency shift in the first direction, the controller 30c sets the source frequency f(k, m, n) to a frequency resulting from the frequency shift in the first direction from the source frequency f(k−$K_2$, m, n). For example, when the power level Pr(k−$K_2$, m, n) decreases from the power level Pr(k−$K_1$, m, n) in response to the frequency shift in the first direction, the controller 30c sets the source frequency f(k, m, n) to a frequency resulting from the frequency shift in the first direction from the source frequency f(k−$K_2$, in, n). The symbol Pr(k, m, n) indicates the power level Pr of the reflected wave of the source radio-frequency power RF in the phase period SP(k, m, n). The source frequency in the phase period SP(m, n) in each of two or more overlap periods preceding the overlap period OP(k) may be updated to be a frequency resulting from the frequency shift in the first direction from the source frequency in the phase period SP(m, n) in its corresponding preceding overlap period. In this case, for an upward trend of the degree of reflection (e.g., the power level Pr of the reflected wave) in the phase period SP(m, n) in each of the two or more overlap periods, or their average, the source frequency in the phase period SP(m, n) in the overlap period OP(k) may be set to a frequency resulting from the frequency shift in the second direction. For example, the source frequency in the phase period SP(m, n) in the overlap period OP(k) may be set to a frequency resulting from the frequency shift in the second direction from the source frequency in the earliest of the two or more overlap periods.

In one embodiment, the frequency shift amount Δ(m, n) in the first direction in the phase period SP(k, m, n) may be the same as the frequency shift amount Δ(k−$K_2$, m, n) in the first direction in the phase period SP(k, m−$K_2$, n). More specifically, the frequency shift amount Δ(k, m, n) may have the same absolute value as the frequency shift amount Δ(k−$K_2$, m, n). In some embodiments, the frequency shift amount Δ(k, m, n) may have a greater absolute value than the frequency shift amount Δ(k−$K_2$, m, n). In some embodiments, the frequency shift amount Δ(k, m, n) may have a greater absolute value for a greater degree of reflection (e.g., for a greater power level Pr(k−$K_2$, m, n) of the reflected wave) in the phase period SP(k−$K_2$, m, n). For example, the frequency shift amount Δ(k, m, n) may have the absolute value determined by a function of the degree of reflection (the power level Pr(k−1, m, n) of the reflected wave).

In the interpulse feedback, the source frequency f(k−$K_2$, m, n) resulting from the frequency shift in the first direction can increase the degree of reflection. For example, the power level Pr(k−1, m, n) of the reflected wave can increase from the power level Pr(k−2, m, n) of the reflected wave in response to the frequency shift in the first direction. In this case, the controller 30c may set the source frequency f(k, m, n) to a frequency resulting from the frequency shift in the second direction from the source frequency f(k−$K_2$, m, n).

In the interpulse feedback, the source frequency f(k, m, n) resulting from the frequency shift in the first direction can increase the degree of reflection. For example, the power level Pr(k, m, n) of the reflected wave can increase from the power level Pr(k−$K_2$, m, n) of the reflected wave in response to the frequency shift in the first direction. In this case, the controller 30c may set the source frequency in the phase period SP(k+$K_3$, m, n) to an intermediate frequency. In other words, the source frequency in the phase period SP(n) in the waveform cycle CY(m) in the overlap period OP(k+$K_3$) may be set to an intermediate frequency. The overlap period OP(k+$K_3$) is subsequent to the overlap period OP(k), where $K_3$ is a natural number that may satisfy $K_3$=$K_2$. The intermediate frequency that may be set in the phase period SP(k+$K_3$, m, n) is between the source frequencies f(k−$K_2$, m, n) and f(k, m, n), and may be the average of the source frequencies f(k−$K_2$, m, n) and f(k, m, n).

In the interpulse feedback, the degree of reflection (e.g., the power level Pr) can exceed a predetermined threshold when the intermediate frequency is set in the phase period SP(k+$K_3$, m, n). In this case, the controller 30c may set the source frequency in the phase period SP(k+$K_4$, m, n) to a frequency resulting from the frequency shift in the second direction from the intermediate frequency.

In other words, in this case, the source frequency in the phase period SP(n) in the waveform cycle CY(m) in the overlap period OP(k+$K_4$) may be set to a frequency resulting from the frequency shift in the second direction. The overlap period OP(k+$K_4$) is subsequent to the overlap period OP(k+$K_3$), where $K_4$ is a natural number that satisfies $K_4$>$K_3$ and may satisfy $K_4$=$K_1$. The threshold is predetermined. The frequency shift amount Δ(k+$K_4$, m, n) in the second direction has a greater absolute value than the frequency shift amount Δ(k, m, n) in the first direction. This avoids the situation in which the degree of reflection (e.g., the power level Pr of the reflected wave) fails to decrease from a local minimum value. The thresholds for the multiple phase periods SP in each of the multiple waveform cycles CY in each of the multiple the overlap periods OP may be the same as or different from one another.

The plasma processing apparatus 1 may use, as the degree of reflection in each phase period, a representative value of measurement values in the phase period. The representative value may be the average or the maximum of measurement values in each phase period. The plasma processing apparatus 1 may use, as the measurement value, at least one of the power level Pr of the reflected wave described above, the ratio of the power level Pr of the reflected wave to the output power level of the source radio-frequency power RF (hereafter, a reflectance), a phase difference θ between a voltage V and an current I, or an impedance Z of the load coupled to the RF power supply 31.

The plasma processing apparatus 1 may include a voltage-current (VI) sensor in addition to or in place of the above sensor 31s. The VI sensor measures the voltage V and the current I on the feed line for the source radio-frequency power RF between the RF power supply 31 and the RF electrode. The VI sensor may be coupled between the RF power supply 31 and the matcher 31m. The VI sensor may be coupled between the matcher 31m and the RF electrode. For example, the VI sensor may be coupled between the bias electrode and the junction of an electric path extending from the matcher 31m to the bias electrode and an electric path extending from the matcher 32m to the bias electrode. In some embodiments, the VI sensor may be coupled between the junction and the matcher 31m. The VI sensor may be a part of the matcher 31m.

The source frequency for each of the multiple phase periods SP in each waveform cycle CY may be changed based on the voltage V, the current I, and the phase difference θ between the voltage V and the current I to cause the impedance of the load coupled to the RF power supply 31 to be closer to the matching point. The variable impedance of the matcher 31m may be adjusted based on the voltage V, the current I, and the phase difference θ to cause the impedance Z of the load coupled to the RF power supply 31 to be closer to the matching point. When the feed line for the source radio-frequency power RF has a characteristic impedance of 50Ω the matching point has a real resistive component of 50Ω, and the phase difference θ is 0°.

Figure 9:
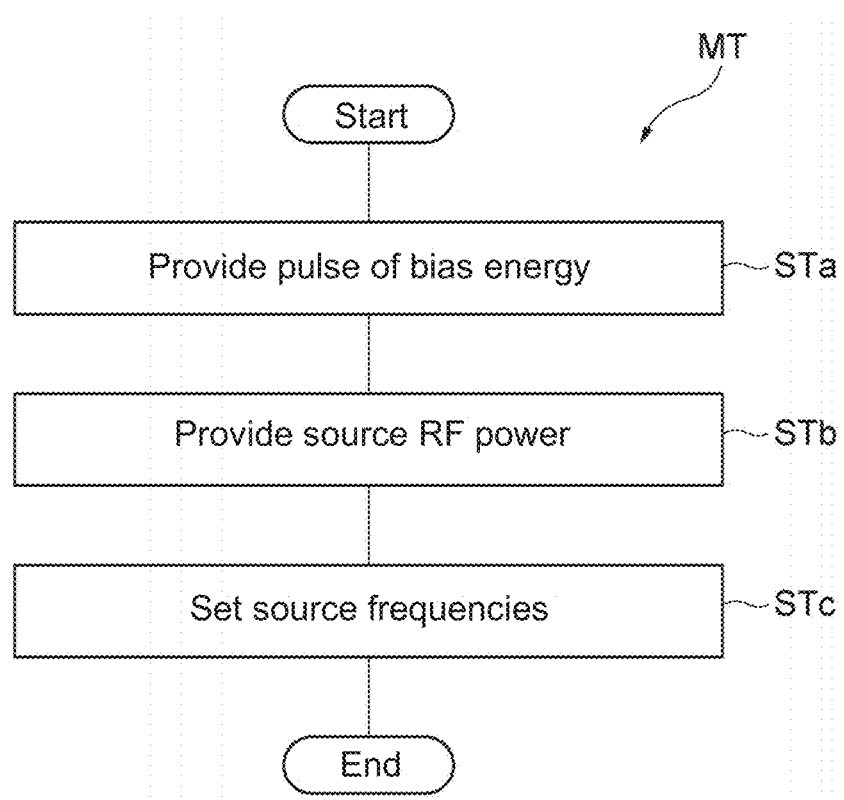
FIG. 9 is a flowchart of a method for controlling the source frequency of source RF power according to one exemplary embodiment.
Figure 10A:
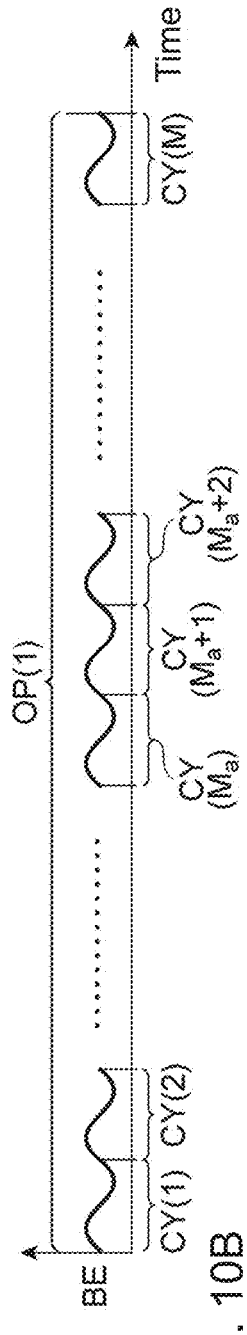
FIGS. 10A to 10D are each another example timing chart of bias energy.
Figure 10B:
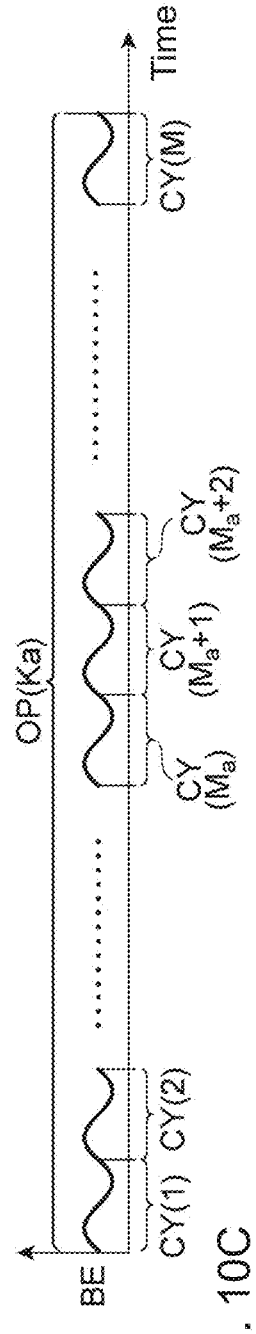
Figure 10C:
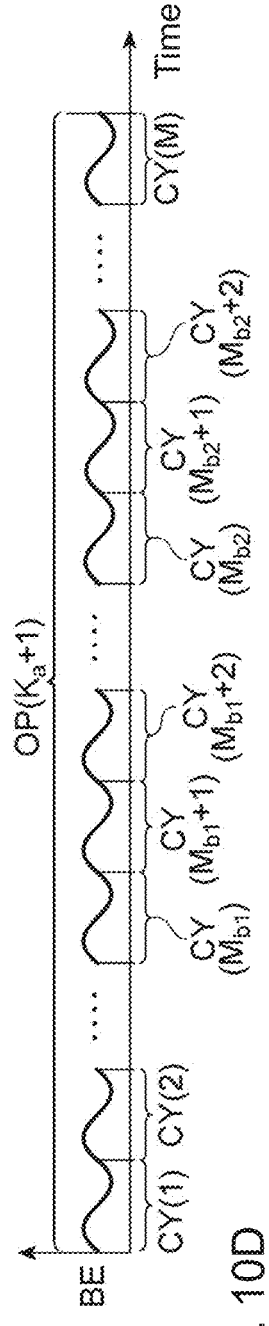
Figure 10D:
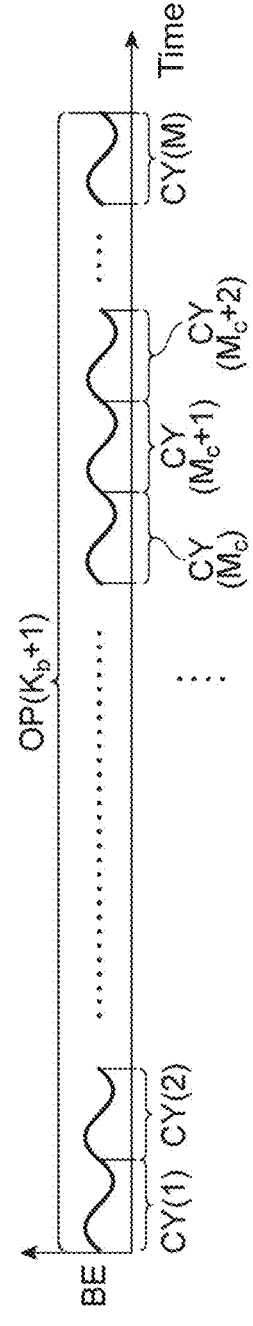

A method for controlling the source frequency of source RF power according to one exemplary embodiment will now be described with reference to FIG. 9. FIG. 9 is a flowchart of a method for controlling the source frequency of source RF power according to one exemplary embodiment. A method MT in FIG. 9 starts from step STa or step STb. In step STa, the pulse BEP of the bias energy BE is provided to the bias electrode on the substrate support 11 in the plasma processing apparatus 1. The pulse BEP of the bias energy BE is provided to the bias electrode in each of the multiple pulse periods PP.

In step STb, the source radio-frequency power RF is provided from an RF power supply (e.g., the RF power supply 31) to generate plasma in the chamber. The source radio-frequency power RF is provided as illustrated in FIG. 3A, 3B, 4A, or 4B.

In step STc, the source frequency of the source radio-frequency power RF is set for each of the multiple phase periods SP in each of the multiple waveform cycles CY included in each of the multiple overlap periods OP. In the interpulse feedback, the source frequency in the phase period SP(k, m, n) in the waveform cycle CY(m) in the overlap period OP(k) is adjusted based on a change in the degree of reflection of the source RF power. In the interpulse feedback, the change in the degree of reflection (e.g., the power level Pr of the reflected wave) is identified with the source frequency being set differently in the corresponding phase period SP(n) in the waveform cycle CY(m) in each of two or more overlap periods OP preceding the overlap period OP(k). The interpulse feedback is performed in the manner described above.

FIGS. 10A to 10D will now be referred to. FIGS. 10A to 10D are each another example timing chart of bias energy. In one embodiment, the multiple overlap periods OP may include first to $K_a$-th overlap periods OP(1) to OP($K_a$), where $K_a$ is a natural number greater than or equal to 2.

The RF power supply 31 may perform the initial process in each of the first to $M_a$-th waveform cycles CY(1) to CY($M_a$) of the multiple waveform cycles CY included in each of the overlap periods OP(1) to OP($K_a$), where $M_a$ is a natural number. In the initial process, a combination of multiple frequency groups may be set for the respective waveform cycles CY(1) to CY($M_a$). The multiple frequency groups included in the combination may be different from each other. Multiple combinations of frequency groups that may be different from each other may be set for the respective overlap periods OP(1) to OP($K_a$). The multiple frequency groups and the multiple combinations of frequency groups may be stored in the storage in the controller 2 or in the controller 30c.

The RF power supply 31 may perform the above intrapulse feedback after the waveform cycle $CY(M_a)$ in the multiple waveform cycles CY in each of the overlap periods OP(1) to $OP(K_a)$. In other words, the RF power supply 31 may perform the above intrapulse feedback in the waveform cycles $CY(M_a+1)$ to CY(M) included in each of the overlap periods OP(1) to $OP(K_a)$.

In one embodiment, the multiple overlap periods OP may further include $(K_a+1)$th to $K_b$-th overlap periods $OP(K_a+1)$ to $OP(K_b)$, where $K_b$ is a natural number greater than or equal to $(K_a+1)$ and may satisfy $K_b=K_a+1$.

The RF power supply 31 may perform the above initial process in each of the first to $M_b1$-th waveform cycles CY(1) to $CY(M_{b1})$ of the multiple waveform cycles CY included in each of the overlap periods $OP(K_a+1)$ to $OP(K_b)$, where $M_{b1}$ is a natural number, and $M_{b1}$ and $M_a$ may satisfy $M_{b1}<M_a$.

The RF power supply 31 may perform the above interpulse feedback in the $(M_{b2}+1)$-th to $M_{b2}$-th waveform cycles $CY(M_{b1}+1)$ to $CY(M_{b2})$ of the multiple waveform cycles CY included in each of the overlap periods $OP(K_a+1)$ to $OP(K_b)$, where $M_{b2}$ is a natural number satisfying $M_{b2}>M_{b1}$.

The RF power supply 31 may perform the above intrapulse feedback after the waveform cycle $CY(M_{b2})$ in each of the overlap periods $OP(K_a+1)$ to $OP(K_b)$. In other words, the RF power supply 31 may perform the above intrapulse feedback in the waveform cycles $CY(M_{b2}+1)$ to CY(M) included in each of the overlap periods $OP(K_a+1)$ to $OP(K_b)$.

The RF power supply 31 may also perform the above interpulse feedback in the first to M-th waveform cycles CY(1) to CY(Me) included in each of the $(K_b+1)$th to last overlap periods $OP(K_b+1)$ to OP(K), where $M_c$ is a natural number. The RF power supply 31 may perform the above intrapulse feedback after the waveform cycle $CY(M_c)$ in each of the overlap periods $OP(K_b+1)$ to OP(K). In other words, the RF power supply 31 may perform the above intrapulse feedback in the waveform cycles $CY(M_c+1)$ to CY(M) included in each of the overlap periods $OP(K_b+1)$ to OP(K).

In one embodiment, in at least one overlap period of the second to last overlap periods OP(2) to OP(K), the RF power supply 31 may set the source frequency in the phase period SP(n) in the waveform cycle CY(MF) to the source frequency in the identical phase period SP(n) in the last waveform cycle CY(M) included in the overlap period immediately preceding the at least one overlap period. The waveform cycle CY(MF) is the earliest waveform cycle of the multiple waveform cycles CY in the at least one overlap period in which the intrapulse feedback is performed. In some embodiments, in the at least one overlap period, the RF power supply 31 may set the source frequency in the phase period SP(n) in the waveform cycle CY(MF) to the average of the source frequencies in the identical phase periods SP(n) in two or more waveform cycles including the last waveform cycle CY(M) included in the overlap period immediately preceding the at least one overlap period. The two or more waveform cycles may be the waveform cycles $CY(m-M_L+1)$ to CY(M) included in the overlap period immediately preceding the at least one overlap period, where $M_L$ is the number of the two or more waveform cycles.

In one embodiment, $M_a$, $M_{b1}$, $M_{b2}$, and $M_c$ above may be preset values. More specifically. $M_a$ and $M_{b1}$ may be preset as the number of waveform cycles in which the initial process is performed. $M_{b2}$ and $M_c$ may be preset as the number of waveform cycles in which the interpulse feedback is performed.

In some embodiments, the RF power supply 31 may end the initial process when a monitor value reflecting the degree of reflection falls within a specified range during the initial process. The RF power supply 31 may end the interpulse feedback when the monitor value reflecting the degree of reflection falls within a specified range during the interpulse feedback.

For the monitor value, one or more measurement values may be used. In some embodiments, the monitor value may indicate the amount of change (the rate of change or difference) in the average in the identical phase periods in waveform cycles for each of one or more measurement values. In some embodiments, the monitor value may indicate the amount of change (the rate of change or difference) over time in the average in the identical phase periods in several waveform cycles for each of one or more measurement values. In some embodiments, the monitor value may indicate the variation in one or more waveform cycles for each of one or more measurement values, or the variation in the identical phase periods in several waveform cycles for each of one or more measurement values. The measurement values may include at least one of the power level Pr of the reflected wave, the above reflectance, the phase difference θ between the voltage V and the current I, the impedance Z, a peak-to-peak voltage (Vpp) across the bias electrode, a self-bias voltage Vdc across the bias electrode, or the plasma emission state.

Although the exemplary embodiments have been described above, the embodiments are not restrictive, and various additions, omissions, substitutions, and changes may be made. The components in the different embodiments may be combined to form another embodiment.

In other embodiments, the plasma processing apparatus may be an ICP plasma processing apparatus, an ECR plasma processing apparatus, an HWP plasma processing apparatus, or an SWP plasma processing apparatus, as described above. Any of the above plasma processing apparatuses uses the source radio-frequency power RF to generate plasma and adjusts the source frequencies for the multiple phase periods SP in the multiple waveform cycles CY, similarly to the plasma processing apparatus 1 described above.

In the intrapulse feedback, the source frequency of the source radio-frequency power RF in the phase period SP(k, m, n) may be determined to be the frequency minimizing the degree of reflection based on two or more degrees of reflection (e.g., the power levels Pr) obtained by setting different source frequencies of the source radio-frequency power RF in the corresponding phase periods SP(n) in two or more waveform cycles CY preceding the waveform cycle CY(k, m) in the overlap period OP(k). The frequency minimizing the degree of reflection may be determined with the method of least squares using the different frequencies and their corresponding degrees of reflection.

In the interpulse feedback, the source frequency f(k, m, n) may be determined to be the frequency minimizing the degree of reflection based on two or more degrees of reflection (e.g., the power levels Pr) obtained by setting different source frequencies of the source radio-frequency power RF in the corresponding phase periods SP(n) in the waveform cycles CY(m) in two or more overlap periods OP preceding the overlap period OP(k). The frequency minimizing the degree of reflection may be determined with the method of least squares using the different frequencies and their corresponding degrees of reflection.

Other embodiments E1 to E9 of the present disclosure will now be described.

E1

A plasma processing apparatus, comprising:
a chamber;
a substrate support located in the chamber and including a bias electrode;
a radio-frequency power supply configured to generate radio-frequency power to generate plasma in the chamber;
a bias power supply configured to provide a pulse of bias energy to the bias electrode in each of a plurality of pulse periods;
a sensor configured to output a reflected wave of the radio-frequency power returning from a load coupled to the radio-frequency power supply; and
a controller configured to control the radio-frequency power supply,
wherein the bias power supply provides the bias energy to the bias electrode in each of a plurality of cycles in each of the plurality of pulse periods, and
the controller sets a frequency of the radio-frequency power in each of a plurality of phase periods in each of the plurality of cycles included in each of a plurality of overlap periods in which the radio-frequency power is provided in the plurality of pulse periods, and adjusts the frequency of the radio-frequency power in an n-th phase period of the plurality of phase periods in an m-th cycle of the plurality of cycles in a k-th overlap period of the plurality of overlap periods based on a change in a power level of the reflected wave output from the sensor occurring when the frequency of the radio-frequency power is set differently in a corresponding phase period in the m-th cycle in each of two or more overlap periods of the plurality of overlap periods preceding the k-th overlap period.

E2

The plasma processing apparatus according to embodiment E1, wherein
the two or more overlap periods include a first overlap period and a second overlap period subsequent to the first overlap period, and
in response to the power level of the reflected wave decreasing with the frequency of the radio-frequency power in the n-th phase period in the m-th cycle in the second overlap period being set to a frequency resulting from a frequency shift in a first direction being one of a decrease or an increase from the frequency of the radio-frequency power in the n-th phase period in the m-th cycle in the first overlap period, the controller sets the frequency of the radio-frequency power in the n-th phase period in the m-th cycle in the k-th overlap period to a frequency resulting from the frequency shift in the first direction from the frequency of the radio-frequency power in the n-th phase period in the m-th cycle in the second overlap period.

E3

The plasma processing apparatus according to embodiment E2, wherein
in response to the power level of the reflected wave increasing with the frequency of the radio-frequency power in the n-th phase period in the m-th cycle in the k-th overlap period being set to the frequency resulting from the frequency shift in the first direction from the frequency of the radio-frequency power in the n-th phase period in the m-th cycle in the second overlap period, the controller sets the frequency of the radio-frequency power in the n-th phase period in the m-th cycle in a third overlap period of the plurality of overlap periods subsequent to the k-th overlap period to an intermediate frequency between the frequency of the radio-frequency power in the n-th phase period in the m-th cycle in the second overlap period and the frequency of the radio-frequency power in the n-th phase period in the m-th cycle in the k-th overlap period.

E4

The plasma processing apparatus according to embodiment E3, wherein
in response to the power level of the reflected wave exceeding a threshold when the intermediate frequency is set in the n-th phase period in the m-th cycle in the third overlap period, the controller sets the frequency of the radio-frequency power in the n-th phase period in the m-th cycle in a fourth overlap period of the plurality of overlap periods subsequent to the third overlap period to a frequency resulting from a frequency shift in a second direction being the other of the decrease or the increase from the intermediate frequency, and an amount of the frequency shift in the second direction has a greater absolute value than an amount of the frequency shift in the first direction.

E5

The plasma processing apparatus according to embodiment E2, wherein
an amount of the frequency shift in the first direction has a greater absolute value for the frequency of the radio-frequency power in the n-th phase period in the m-th cycle in the k-th overlap period than for the frequency of the radio-frequency power in the n-th phase period in the m-th cycle in the second overlap period.

E6

The plasma processing apparatus according to embodiment E1, wherein
the two or more overlap periods include a first overlap period and a second overlap period subsequent to the first overlap period, and
in response to the power level of the reflected wave increasing with the frequency of the radio-frequency power in the n-th phase period in the m-th cycle in the second overlap period being set to a frequency resulting from a frequency shift in a first direction being one of a decrease or an increase from the frequency of the radio-frequency power in the n-th phase period in the m-th cycle in the first overlap period, the controller sets the frequency of the radio-frequency power in the n-th phase period in the m-th cycle in the k-th overlap period to a frequency resulting from a frequency shift in a second direction being the other of the decrease or the increase from the frequency of the radio-frequency power in the n-th phase period in the m-th cycle in the second overlap period.

E7

The plasma processing apparatus according to any one of embodiments E1 to E6, wherein
the bias energy is radio-frequency power having a bias frequency defining the plurality of cycles, or includes a pulse of a voltage provided to the bias electrode in each of the plurality of cycles defined by the bias frequency.

E8

A method for controlling a frequency of radio-frequency power, the method comprising:
providing a pulse of bias energy to a bias electrode in each of a plurality of pulse periods, the bias electrode being located on a substrate support in a chamber in a plasma processing apparatus, the pulse of the bias energy including bias energy provided to the bias electrode in each of a plurality of cycles in each of the plurality of pulse periods;

providing the radio-frequency power from a radio-frequency power supply to generate plasma in the chamber; and setting a frequency of the radio-frequency power in each of a plurality of phase periods in each of the plurality of cycles included in each of a plurality of overlap periods in which the radio-frequency power is provided in the plurality of pulse periods, wherein the frequency of the radio-frequency power in an n-th phase period of the plurality of phase periods in an m-th cycle of the plurality of cycles in a k-th overlap period of the plurality of overlap periods is adjusted based on a change in a power level of a reflected wave of the radio-frequency power occurring w % ben the frequency of the radio-frequency power is set differently in a corresponding phase period in the m-th cycle in each of two or more overlap periods of the plurality of overlap periods preceding the k-th overlap period.

The exemplary embodiments according to the present disclosure have been described by way of example, and various changes may be made without departing from the scope and spirit of the present disclosure. The exemplary embodiments disclosed above are thus not restrictive, and the true scope and spirit of the present disclosure are defined by the appended claims.

REFERENCE SIGNS LIST

1 Plasma processing apparatus
10 Plasma processing chamber
11 Substrate support
31 RF power supply
32 Bias power supply
31s Sensor
30c Controller

The invention claimed is:

1. A plasma processing apparatus, comprising:
a chamber;
a substrate support located in the chamber and including a bias electrode;
a radio-frequency power supply configured to generate source radio-frequency power to generate plasma in the chamber; and
a bias power supply configured to provide a pulse of bias energy to the bias electrode in each of a plurality of pulse periods,
wherein the bias power supply is configured to periodically provide the bias energy having a waveform cycle to the bias electrode in each of the plurality of pulse periods,
the radio-frequency power supply is configured to set a source frequency of the source radio-frequency power in each of a plurality of phase periods in each of a plurality of waveform cycles of the bias energy included in each of a plurality of overlap periods, and each of the plurality of overlap periods being an overlap in time with a corresponding pulse period of the plurality of pulse periods, and
the radio-frequency power supply is configured to perform interpulse feedback to adjust the source frequency in an n-th phase period of the plurality of phase periods in an m-th waveform cycle of the plurality of waveform cycles of the bias energy in a k-th overlap period of the plurality of overlap periods based on a change in a degree of reflection of the source radio-frequency power occurring when the source frequency is set differently in the n-th phase period in the m-th waveform cycle in each of two or more overlap periods of the plurality of overlap periods preceding the k-th overlap period.

2. The plasma processing apparatus according to claim 1, wherein
the two or more overlap periods include a $(k-K_1)$th overlap period and a $(k-K_2)$th overlap period, and $K_1$ and $K_2$ are natural numbers satisfying $K_1 > K_2$, and
the radio-frequency power supply is configured to have the interpulse feedback set, in response to the degree of reflection decreasing with the source frequency in the n-th phase period in the m-th waveform cycle in the $(k-K_2)$th overlap period being set to a frequency resulting from a frequency shift in a first direction being one of a decrease or an increase from the source frequency in the n-th phase period in the m-th waveform cycle in the $(k-K_1)$th overlap period, the source frequency in the n-th phase period in the m-th waveform cycle in the k-th overlap period to a frequency resulting from the frequency shift in the first direction from the source frequency in the n-th phase period in the m-th waveform cycle in the $(k-K_2)$ overlap period.

3. The plasma processing apparatus according to claim 2, wherein
the radio-frequency power supply is further configured to have the interpulse feedback set, in response to the degree of reflection increasing with the source frequency in the n-th phase period in the m-th waveform cycle in the k-th overlap period being set to the frequency resulting from the frequency shift in the first direction from the source frequency in the n-th phase period in the m-th waveform cycle in the $(k-K_2)$th overlap period, the source frequency in the n-th phase period in the m-th waveform cycle in a $(k+K_3)$th overlap period of the plurality of overlap periods subsequent to the k-th overlap period to an intermediate frequency between the source frequency in the n-th phase period in the m-th waveform cycle in the $(k-K_2)$ overlap period and the source frequency in the n-th phase period in the m-th waveform cycle in the k-th overlap period.

4. The plasma processing apparatus according to claim 3, wherein
the radio-frequency power supply is further configured to have the interpose feedback set, in response to the degree of reflection exceeding a threshold when the intermediate frequency is set in the n-th phase period in the m-th waveform cycle in the $(k+K_3)$th overlap period, the source frequency in the n-th phase period in the m-th waveform cycle in an overlap period of the plurality of overlap periods subsequent to the $(k+K_3)$th overlap period to a frequency resulting from a frequency shift in a second direction being the other of the decrease or the increase from the intermediate frequency, and an amount of the frequency shift in the second direction has a greater absolute value than an amount of the frequency shift in the first direction.

5. The plasma processing apparatus according to claim 2, wherein
an amount of the frequency shift in the first direction has a greater absolute value for the source frequency in the n-th phase period in the m-th waveform cycle in the k-th overlap period than for the source frequency in the n-th phase period in the m-th waveform cycle in the $(k-K_2)$th overlap period.

6. The plasma processing apparatus according to claim 1, wherein
the two or more overlap periods include a $(k-K_1)$th overlap period and a $(k-K_2)$th overlap period, and $K_1$ and $K_2$ are natural numbers satisfying $K_1 > K_2$, and
the radio-frequency power supply is further configure to have the interpulse feedback set, in response to the degree of reflection increasing with the source frequency in the n-th phase period in the m-th waveform cycle in the $(k-K_2)$th overlap period being set to a frequency resulting from a frequency shift in a first direction being one of a decrease or an increase from the source frequency in the n-th phase period in the m-th waveform cycle in the $(k-K_1)$th overlap period, the source frequency in the n-th phase period in the m-th waveform cycle in the k-th overlap period to a frequency resulting from a frequency shift in a second direction being the other of the decrease or the increase from the source frequency in the n-th phase period in the m-th waveform cycle in the $(k-K_2)$th overlap period.

7. The plasma processing apparatus according to claim 1, wherein
the bias energy is bias radio-frequency power having a bias frequency that is an inverse of a time length of the waveform cycle or includes a pulse of a voltage provided to the bias electrode in each of the plurality of waveform cycles, and each of the plurality of waveform cycles has a time length being the inverse of the bias frequency.

8. The plasma processing apparatus according to claim 2, wherein
the bias energy is bias radio-frequency power having a bias frequency that is an inverse of a time length of the waveform cycle or includes a pulse of a voltage provided to the bias electrode in each of the plurality of waveform cycles, and each of the plurality of waveform cycles has a time length being the inverse of the bias frequency.

9. The plasma processing apparatus according to claim 3, wherein
the bias energy is bias radio-frequency power having a bias frequency that is an inverse of a time length of the waveform cycle or includes a pulse of a voltage provided to the bias electrode in each of the plurality of waveform cycles, and each of the plurality of waveform cycles has a time length being the inverse of the bias frequency.

10. The plasma processing apparatus according to claim 1, wherein
the plurality of overlap periods include first to $K_a$-th overlap periods, and $K_a$ is a natural number greater than or equal to 2, and
the radio-frequency power supply is configured to perform, in each of first to $M_a$-th waveform cycles of the plurality of waveform cycles included in each of the first to $K_a$-th overlap periods, an initial process to set source frequencies in the plurality of phase periods to a plurality of frequencies included in a predefined frequency group, and
perform, after the $M_a$-th waveform cycle of the plurality of waveform cycles in each of the first to $K_a$-th overlap periods, intrapulse feedback to adjust the source frequency in the n-th phase period in the m-th waveform cycle based on a change in the degree of reflection of the source radio-frequency power occurring when the source frequency is set differently in the n-th phase period in each of two or more waveform cycles of the plurality of waveform cycles preceding the m-th waveform cycle.

11. The plasma processing apparatus according to claim 2, wherein
the plurality of overlap periods include first to $K_a$-th overlap periods, and $K_a$ is a natural number greater than or equal to 2, and
the radio-frequency power supply is configured to perform, in each of first to $M_a$-th waveform cycles of the plurality of waveform cycles included in each of the first to $K_a$-th overlap periods, an initial process to set source frequencies in the plurality of phase periods to a plurality of frequencies included in a predefined frequency group, and
perform, after the $M_a$-th waveform cycle of the plurality of waveform cycles in each of the first to $K_a$-th overlap periods, intrapulse feedback to adjust the source frequency in the n-th phase period in the m-th waveform cycle based on a change in the degree of reflection of the source radio-frequency power occurring when the source frequency is set differently in the n-th phase period in each of two or more waveform cycles of the plurality of waveform cycles preceding the m-th waveform cycle.

12. The plasma processing apparatus according to claim 3, wherein
the plurality of overlap periods include first to $K_a$-th overlap periods, and $K_a$ is a natural number greater than or equal to 2, and
the radio-frequency power supply is configured to perform, in each of first to $M_a$-th waveform cycles of the plurality of waveform cycles included in each of the first to $K_a$-th overlap periods, an initial process to set source frequencies in the plurality of phase periods to a plurality of frequencies included in a predefined frequency group, and
perform, after the $M_a$-th waveform cycle of the plurality of waveform cycles in each of the first to $K_a$-th overlap periods, intrapulse feedback to adjust the source frequency in the n-th phase period in the m-th waveform cycle based on a change in the degree of reflection of the source radio-frequency power occurring when the source frequency is set differently in the n-th phase period in each of two or more waveform cycles of the plurality of waveform cycles preceding the m-th waveform cycle.

13. The plasma processing apparatus according to claim 4, wherein
the plurality of overlap periods include first to $K_a$-th overlap periods, and $K_a$ is a natural number greater than or equal to 2, and
the radio-frequency power supply is configured to perform, in each of first to $M_a$-th waveform cycles of the plurality of waveform cycles included in each of the first to $K_a$-th overlap periods, an initial process to set source frequencies in the plurality of phase periods to a plurality of frequencies included in a predefined frequency group, and
perform, after the waveform cycle of the plurality of waveform cycles in each of the first to $K_a$-th overlap periods, intrapulse feedback to adjust the source frequency in the n-th phase period in the m-th waveform cycle based on a change in the degree of reflection of the source radio-frequency power occurring when the source frequency is set differently in the n-th phase period in each of two or more waveform cycles of the plurality of waveform cycles preceding the m-th waveform cycle.

14. The plasma processing apparatus according to claim 12, wherein
the plurality of overlap periods further include $(K_a+1)$th to $K_b$-th overlap periods, and $K_b$ is a natural number greater than or equal to $(K_a+1)$, and
the radio-frequency power supply is configured to perform the initial process in each of first to $M_{b1}$-th waveform cycles of the plurality of waveform cycles included in each of the $(K_a+1)$th to $K_b$-th overlap periods,
perform the interpulse feedback in $(M_{b1}+1)$th to $M_{b2}$-th waveform cycles of the plurality of waveform cycles included in each of the $(K_a+1)$th to $K_b$-th overlap periods, and
perform the intrapulse feedback after the $M_{b2}$-th waveform cycle in each of the $(K_a+1)$th to $K_b$-th overlap periods, and $M_{b1}$ and $M_a$ satisfy $M_{b1}<M_a$.

15. The plasma processing apparatus according to claim 14, wherein
the radio-frequency power supply is configured to perform the interpulse feedback in first to $M_c$-th waveform cycles of the plurality of waveform cycles included in each of $(K_b+1)$th to last overlap periods of the plurality of overlap periods, and
perform the intrapulse feedback after the $M_c$-th waveform cycle in each of the $(K_b+1)$th to last overlap periods.

16. The plasma processing apparatus according to claim 12, wherein
in at least one overlap period of second to last overlap periods of the plurality of overlap periods, the radio-frequency power supply is configured to set the source frequency in the n-th phase period in an earliest waveform cycle of the plurality of waveform cycles in which the intrapulse feedback is performed to the source frequency in the n-th phase period in a last waveform cycle of the plurality of waveform cycles included in an overlap period of the plurality of overlap periods immediately preceding the at least one overlap period, or to an average of source frequencies in n-th phase periods in two or more waveform cycles of the plurality of waveform cycles including the last waveform cycle.

17. The plasma processing apparatus according to claim 15, wherein
in at least one overlap period of second to last overlap periods of the plurality of overlap periods, the radio-frequency power supply is configured to set the source frequency in the n-th phase period in an earliest waveform cycle of the plurality of waveform cycles in which the intrapulse feedback is performed to the source frequency in the n-th phase period in a last waveform cycle f the plurality of waveform cycles included in an overlap period the plurality of overlap periods immediately preceding the at least one overlap period, or to an average of source frequencies in n-th phase periods in two or more waveform cycles of the plurality of waveform cycles including the last waveform cycle.

18. The plasma processing apparatus according to claim 12, wherein
the radio-frequency power supply is configured to end the initial process under a condition a monitor value reflecting the degree of reflection falls within a specified range during the initial process.

19. The plasma processing apparatus according to claim 16, wherein
the radio-frequency power supply is configured to end the initial process under a condition a monitor value reflecting the degree of reflection falls within a specified range during the initial process.

20. A method for controlling a source frequency of source radio-frequency power, the method comprising:
periodically providing a pulse of bias energy having a waveform cycle to a bias electrode in each of a plurality of pulse periods, the bias electrode being located on a substrate support in a chamber in a plasma processing apparatus;
providing the source radio-frequency power from a radio-frequency power supply to generate plasma in the chamber; and
setting a source frequency the source radio-frequency power in each of a plurality of phase periods in each of a plurality of waveform cycles of the bias energy included in each of a plurality of overlap periods, each of the plurality of overlap periods being an overlap in time with a corresponding pulse period of the plurality of pulse periods,
wherein the source frequency in an n-th phase period of the plurality of phase periods in an m-th waveform cycle of the plurality of waveform cycles of the bias energy in a k-th overlap period of the plurality of overlap periods is adjusted based on a change in a degree of reflection of the source radio-frequency power occurring when the source frequency is set differently in the n-th phase period in the m-th waveform cycle in each of two or more overlap periods of the plurality of overlap periods preceding the k-th overlap period.

* * * * *